(12) United States Patent
Chiu et al.

(10) Patent No.: US 9,559,049 B1
(45) Date of Patent: Jan. 31, 2017

(54) MEMORY DEVICE AND METHOD OF MANUFACTURING THE SAME

(71) Applicant: MACRONIX International Co., Ltd., Hsinchu (TW)

(72) Inventors: Yuan-Chieh Chiu, Hsinchu (TW); Shih-Ping Hong, Hsinchu (TW); Yao-An Chung, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/827,971

(22) Filed: Aug. 17, 2015

(51) Int. Cl.
*H01L 45/00* (2006.01)
*H01L 43/12* (2006.01)
*H01L 23/522* (2006.01)
*H01L 23/528* (2006.01)
*H01L 23/532* (2006.01)
*H01L 21/48* (2006.01)

(52) U.S. Cl.
CPC ......... *H01L 23/5222* (2013.01); *H01L 21/486* (2013.01); *H01L 21/4846* (2013.01); *H01L 21/4853* (2013.01); *H01L 23/528* (2013.01); *H01L 23/5226* (2013.01); *H01L 23/5329* (2013.01)

(58) Field of Classification Search
CPC .................. H01L 23/5222; H01L 21/4846
USPC ............................... 257/773; 438/622
See application file for complete search history.

(56) References Cited

U.S. PATENT DOCUMENTS

2014/0124729 A1* 5/2014 Hwang ............... H01L 27/2454
257/5

* cited by examiner

*Primary Examiner* — Cuong Q Nguyen
*Assistant Examiner* — Tong-Ho Kim
(74) *Attorney, Agent, or Firm* — J.C. Patents

(57) ABSTRACT

Provided is a memory device including a plurality of first conductive line layers, a plurality of support structures, and a charge storage layer. Each of the first conductive line layers extends along a plane defined by a first direction and a second direction. Each of the first conductive line layers includes a plurality of first conductive lines extending along the first direction. The support structures are located between the adjacent first conductive line layers. The charge storage layer covers upper surfaces, lower surfaces, and two side surfaces of the first conductive lines and surfaces of the support structures.

20 Claims, 42 Drawing Sheets

MEMORY DEVICE AND METHOD OF MANUFACTURING THE SAME

BACKGROUND OF THE INVENTION

Field of the Invention

The invention relates to a memory device and a manufacturing method thereof, and more particularly relates to a memory device having a support structure and a manufacturing method thereof.

Description of Related Art

With the advancement of technology, the development of electronic devices has increased the need for larger storage capacity. In order to meet the demand for high storage density, the sizes of memory devices are reduced and the integration is improved. Therefore, the memory devices have been developed from two-dimensional (2D) memory devices that have a planar gate structure to three-dimensional (3D) memory devices that have a vertically stacked gate structure.

As the integration of 3D memory devices improves, the conventional 3D vertical gate (VG) framework provides a higher storage density than the vertical channel (VC) one because the total stacking layers of VC are limited by the finite bit-line driving current. However, even VG exhibits the higher possibility of CD shrinkage, it still faces a manufacturing issue because of distortion and collapse of the three-dimensional structure induced by a high aspect-ratio geometry. In view of the above, how to develop a highly-integrated 3D memory device to seek for a higher storage density and how to develop a manufacturing method thereof while preventing the problems of distortion and collapse of the three-dimensional structure is an important issue that needs to be addressed.

SUMMARY OF THE INVENTION

The invention provides a 3D memory device having a support structure and a manufacturing method thereof, for preventing distortion and collapse of a three-dimensional memory device.

The invention provides a memory device, including a plurality of first conductive line layers, a plurality of support structures, a charge storage layer. Each of the first conductive line layers extends along a plane defined by a first direction and a second direction, and each of the first conductive line layers includes a plurality of first conductive lines extending in the first direction. The support structures are disposed between the adjacent first conductive line layers. The support structures and the first conductive lines have different shapes. The charge storage layer covers upper surfaces, lower surfaces, and two side surfaces of the first conductive lines, and surfaces of the support structures.

In an embodiment of the invention, the first conductive lines and the support structures are formed of different materials.

In an embodiment of the invention, the material of the support structures includes an insulating material, a dielectric material, a low-k material, or a combination thereof.

In an embodiment of the invention, the material of the support structure includes SiO, SiN, SiON, SiOC, SiC, SiOF, SiOH, or a combination thereof.

In an embodiment of the invention, each of the support structures is a continuous support structure and further passes through the first conductive lines.

In an embodiment of the invention, the support structures include a pillar structure, a wave structure, a sheet structure, a corrugated structure, or a combination thereof.

In an embodiment of the invention, the support structures include a plurality of pillar structures, and a profile of two sidewalls of the pillar structures includes a rectangle, a trapezoid, an hourglass shape, an egg shape, an irregular shape, or a combination thereof.

In an embodiment of the invention, a shape of an upper surface of the support structures includes a circle, an ellipse, a square, a star shape, a heart shape, a mushroom shape, a double-peak shape, a bowknot shape, or a combination thereof.

In an embodiment of the invention, the memory device further includes a plurality of second conductive line layers. Each of the second conductive line layers extends along a plane defined by the second direction and a third direction. Each of the second conductive line layers is disposed between adjacent two support structures and surrounds a portion of the charge storage layer around the corresponding one of the first conductive lines. The first direction, the second direction, and the third direction are perpendicular to each other.

In an embodiment of the invention, the memory device includes a plurality of memory cells that are arranged in a three-dimensional array. Each of the memory cells includes a portion of one of the first conductive lines, a portion of the charge storage layer surrounding the corresponding one of the first conductive lines, and a portion of the second conductive line layer covering the corresponding charge storage layer.

In an embodiment of the invention, at least one support structure is disposed between adjacent two memory cells.

In an embodiment of the invention, the memory device further includes a plurality of dielectric pillars extending in the third direction and arranged alternately with the second conductive line layers in the first direction.

The invention provides a manufacturing method for manufacturing a memory device, which includes the following steps. A stack layer is provided. The stack layer includes a plurality of first conductive line layers and a plurality of support material layers. The support material layers are disposed alternately with the first conductive line layers. The first conductive line layers and the support material layers are formed of different materials. The support material layers and the first conductive line layers extend along a plane defined by a first direction and a second direction. A plurality of openings are formed in the stack layer. The openings pass through the stack layer. A portion of the support material layers is removed through the openings by performing an etching process, so as to form a plurality of support structures between the first conductive line layers.

In an embodiment of the invention, the etching process includes a dry etching process, a wet etching process, or a combination thereof.

In an embodiment of the invention, an etching selectivity between the support material layers and the first conductive line layers is equal to or greater than 5.

In an embodiment of the invention, the manufacturing method further includes forming a charge storage layer on surfaces of the first conductive line layers and the support structures after forming the support structures. A plurality of second conductive line layers that are arranged in a second direction are formed between adjacent two support structures. Each of the second conductive line layers extends along a plane defined by the second direction and a third direction. Each of the second conductive line layers surrounds a portion of the charge storage layer around the corresponding one of the first conductive line layers. The first direction, the second direction, and the third direction are perpendicular to each other. A plurality of dielectric pillars are formed in the stack layer. The dielectric pillars extend in the third direction and are arranged alternately with the second conductive line layers in the first direction.

The invention provides a manufacturing method for manufacturing a memory device, which includes the following steps. A stack layer is provided. The stack layer includes a plurality of first conductive line layers and a plurality of first material layers. The first material layers are disposed alternately with the first conductive line layers. The first conductive line layers and the first material layers are formed of different materials. The first material layers and the first conductive line layers extend along a plane defined by a first direction and a second direction. A plurality of support structures are formed in the stack layer. Each of the support structures is a continuous support structure and passes through the first conductive line layers of the stack layer. A plurality of openings are formed in the stack layer. The openings pass through the stack layer. The first material layers are removed through the openings by performing an etching process.

In an embodiment of the invention, the etching process includes a dry etching process, a wet etching process, or a combination thereof.

In an embodiment of the invention, the first conductive line layers, the first material layers, and the support structures are formed of different materials. An etching selectivity between the first material layers and the support structures and an etching selectivity between the first material layers and the first conductive line layers are equal to or greater than 5 respectively.

In an embodiment of the invention, the manufacturing method further includes forming a charge storage layer on surfaces of the first conductive line layers and the support structures after performing the etching process. A plurality of second conductive line layers are formed and arranged in a second direction. Each of the second conductive line layers is disposed between adjacent two support structures. Each of the second conductive line layers extends along a plane defined by the second direction and a third direction and surrounds a portion of the charge storage layer around the corresponding one of the first conductive line layers. The first direction, the second direction, and the third direction are perpendicular to each other. A plurality of dielectric pillars are formed in the stack layer. The dielectric pillars extend in the third direction and are arranged alternately with the second conductive line layers in the first direction.

Based on the above, because the etching selectivity between the first conductive line layer and the support material layer is equal to or greater than 5, the invention uses the aforementioned etching process to form multiple support structures between the patterned first conductive line layers (e.g., the first conductive lines). The support structures of the invention also support the adjacent upper and lower first conductive lines, thereby preventing distortion and collapse of the first conductive lines and the three-dimensional memory device thereof.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

FIG. 1A to FIG. 1G are schematic perspective views showing a method of manufacturing a memory device according to the first embodiment of the invention.

Figure 1A:
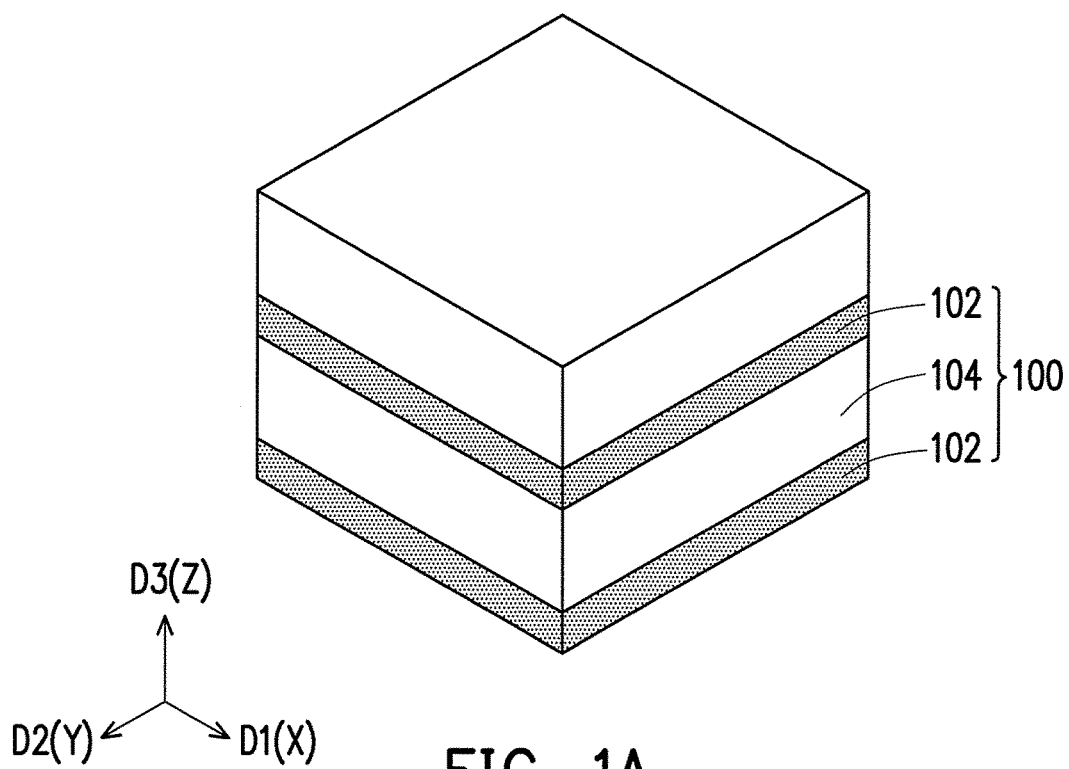
FIG. 1A to FIG. 1G are schematic perspective views showing a method of manufacturing a memory device according to the first embodiment of the invention.

With reference to FIG. 1A, a stack layer 100 is provided. The stack layer 100 includes a plurality of first conductive line layers 102 and a plurality of support material layers 104. The support material layers 104 are disposed between the first conductive line layers 102. The first conductive line layers 102 and the support material layers 104 all extend along a plane (e.g., XY plane) defined by a first direction D1 and a second direction D2 and are arranged alternately in a third direction D3 (e.g., a Z-axis direction). In an embodiment, the thickness of the first conductive line layer 102 is equal to or greater than 5 nm. The thickness of the support material layer 104 is greater than or equal to 45 nm. In this embodiment, the thickness of the support material layer 104 may be 50 nm, for example.

The number of the first conductive line layers 102 and the number of the support material layers 104 of the stack layer 100 may respectively be eight, sixteen, thirty two, or more, for example. However, it should be noted that the invention is not limited thereto. To more clearly explain the technical features of the embodiment of the invention, FIG. 1A illustrates two support material layers 104 as an example, but the invention is not limited thereto. In other embodiments, one support material layer 104 is sufficient to show the spirit and scope of the invention. The same applies to the other embodiments described below. Thus, details thereof are not repeated hereinafter.

A forming method of the stack layer 100 includes alternately forming the first conductive line layers 102 and the support material layers 104, for example. The forming method is chemical vapor deposition or physical vapor deposition, for example. In this embodiment, the first conductive line layers 102 and the support material layers 104 are forming of different materials. The material of the first conductive line layer 102 may include a conductor material. The conductor material may be polysilicon, doped polysilicon, single crystalline silicon, metal silicide, Ti, TiN, W, WN, Ta, TaN, Pt, or a combination thereof, for example. A dielectric material may be SiO, SiN, SiON, SiOC, SiC, SiOF, SiOH, or a combination thereof, for example. The thickness of the first conductive line layer 102 is greater than or equal to 5 nm. In this embodiment, the thickness of the first conductive line layer 102 may be 20 nm, for example.

The material of the support material layer 104 includes an insulating material, a dielectric material, a low-k material, or a combination thereof. The low-k material refers to a dielectric material having a dielectric constant equal to or less than 4. In an embodiment, the material of the support material layer 104 may be SiO, SiN, SiON, SiOC, SiC, SiOF, SiOH, or a combination thereof. The thickness of the support material layer 104 is greater than or equal to 45 nm. In this embodiment, the thickness of the support material layer 104 may be 50 nm, for example.

Figure 1B:
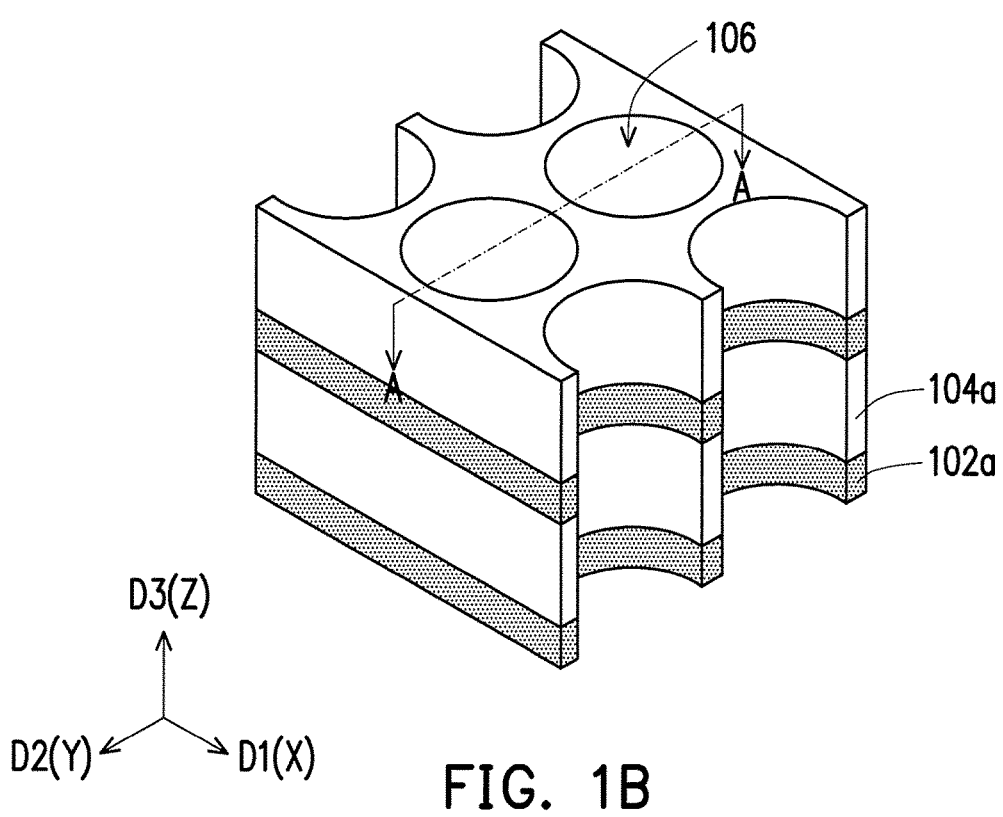

Next, with reference to FIG. 1B, the stack layer 100 is patterned to remove a portion of the first conductive line layers 102 and a portion of the support material layers 104, so as to form a plurality of openings 106 in the stack layer 100. The openings 106 pass through the stack layer 100 in the third direction D3 (e.g., the Z-axis direction). In an embodiment, the openings 106 may be arranged in an array or arranged in the closest manner, or a combination thereof.

Figure 1C:
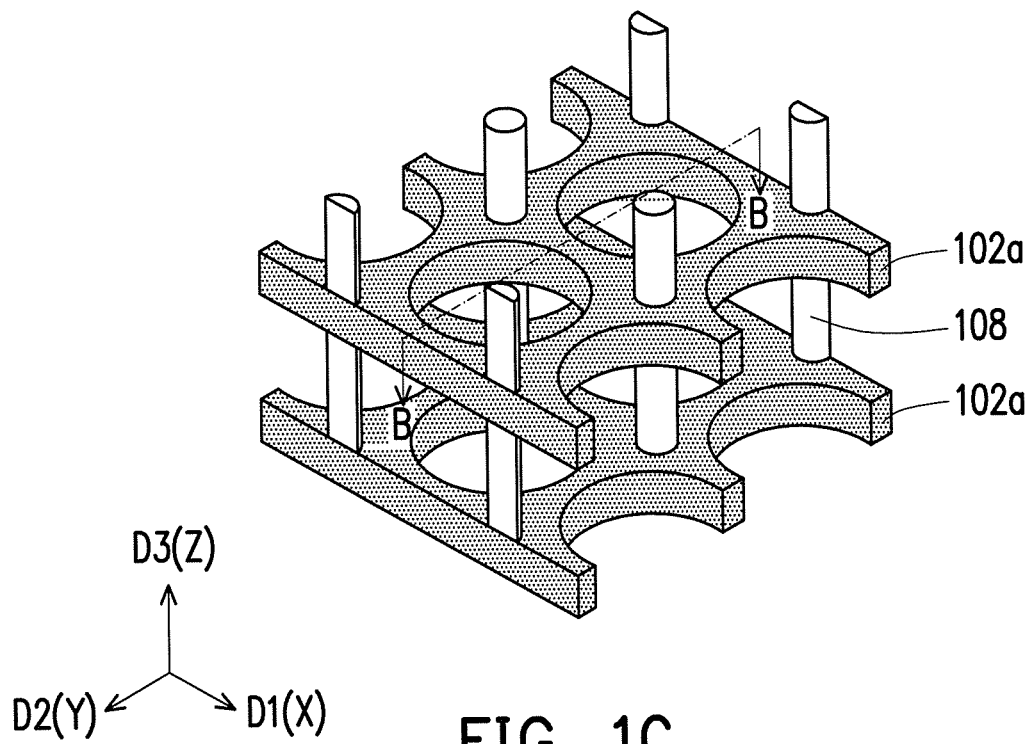

Then, with reference to FIG. 1B and FIG. 1C, a portion of patterned support material layers 104a is removed through the openings 106 by performing an etching process, such that the support material layers 104a remaining between the patterned first conductive line layers 102a form a plurality of support structures 108. Specifically, because an etching selectivity between the patterned support material layers 104a and the patterned first conductive line layers 102a is equal to or greater than 5, when the etching process is performed, a large portion of the patterned support material layers 104a is removed. After adjusting etching parameters of the etching process, the remaining patterned support material layers 104a form a plurality of support structures 108 between the patterned first conductive line layers 102a.

Figure 1D:
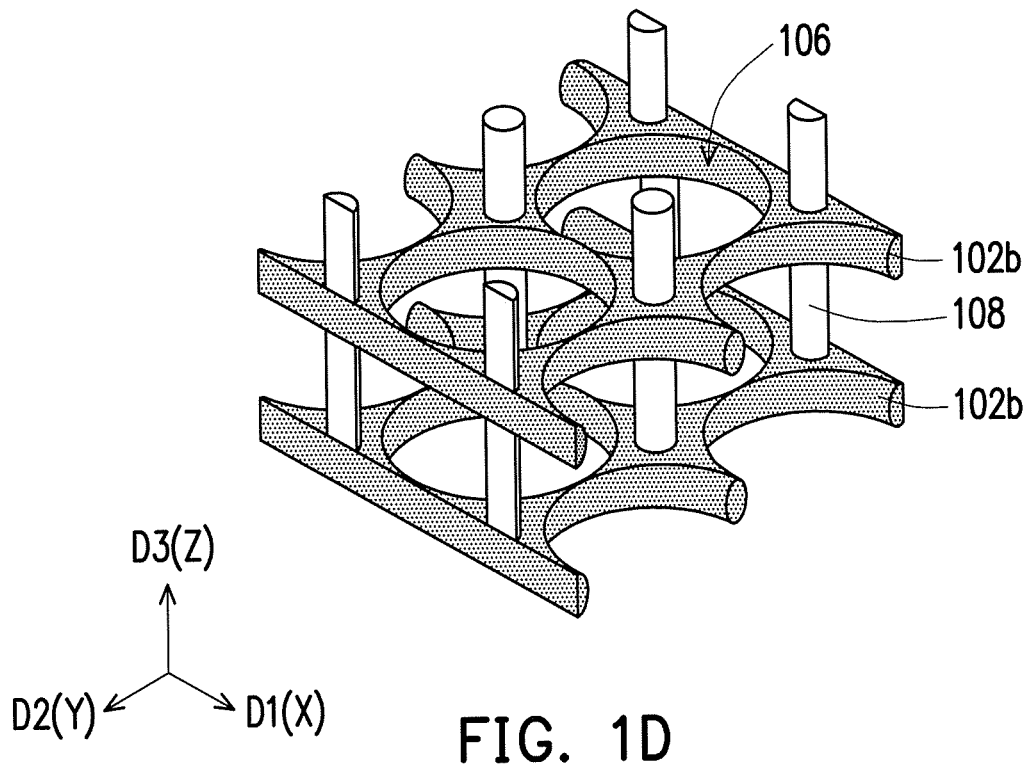
Figure 1E:
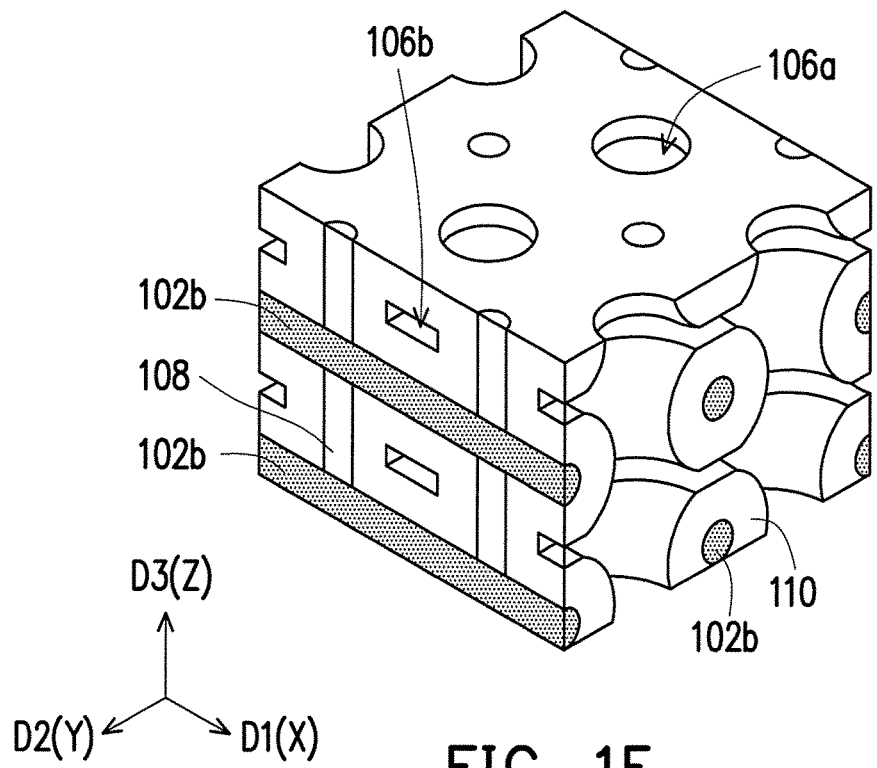

With reference to FIG. 1D and FIG. 1E, before forming a charge storage layer 110, rounded first conductive line layers 102b are formed by selectively performing a rounding process on top corners and bottom corners of the openings 106 in the patterned first conductive line layers 102a. Due to the rounded first conductive line layers 102b, the device exhibits favorable electrical performance. The rounding process includes performing an oxidation process on the patterned first conductive line layers 102a by thermal oxidation, for example. Thereafter, a silicon oxide layer is formed on a surface of the patterned first conductive line layer 102a, and an etch-back process is performed on the silicon oxide layer on the surface of the patterned first conductive line layer 102a by wet etching, so as to remove the silicon oxide layer on the surface of the patterned first conductive line layer 102a.

With reference to FIG. 1E, the charge storage layer 110 is formed on the surfaces of the rounded first conductive line layer 102b and the support structure 108. In an embodiment, the charge storage layer 110 includes a composite layer composed of oxide/nitride/oxide (ONO) (this composite layer may include three or more layers) or a high-k material. The high-k material may be $HfO_2$, $TiO_2$, $ZrO_2$, $Ta_2O_5$, or $Al_2O_3$, for example. A forming method thereof may be chemical vapor deposition, thermal oxidation, or atomic layer deposition. In an embodiment, the thickness of the charge storage layer 110 is in a range of 10 nm to 25 nm. In an embodiment, the thickness of the charge storage layer 110 is in a range of 15 nm to 20 nm, for example. This thickness is sufficient to completely cover the surfaces of the rounded first conductive line layers 102b and the support structures 108 and leave gaps in the openings 106a and 106b.

Figure 1F:
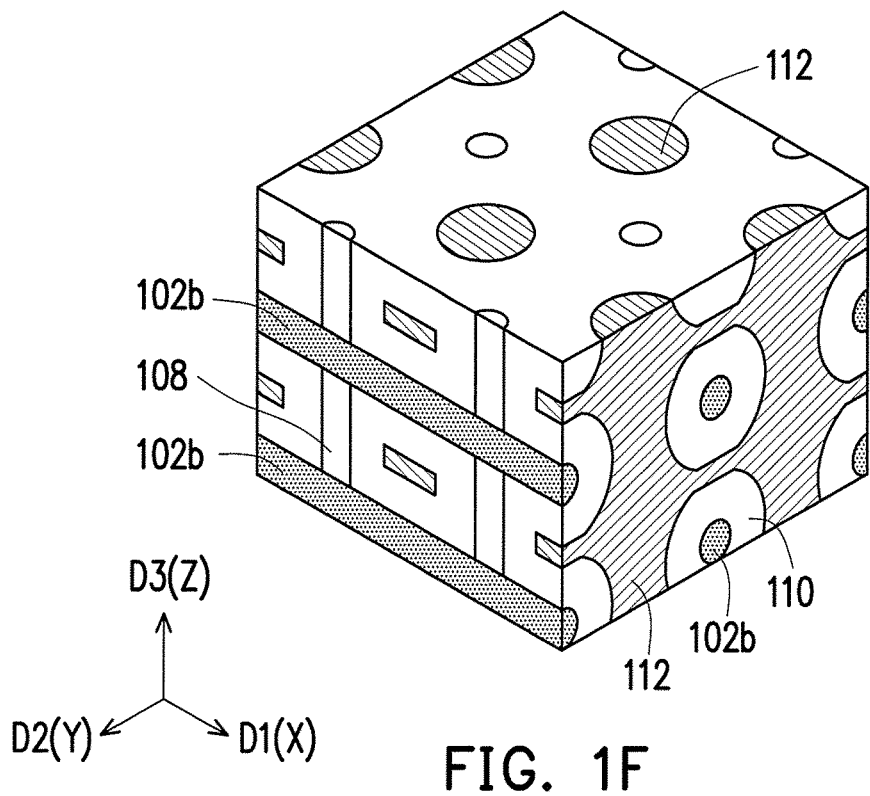

With reference to FIG. 1F, a second conductive line layer 112 is formed on the charge storage layer 110. The second conductive line layer 112 is filled in the opening 106a and the opening 106b, and covers the surface of the charge storage layer 110. A material of the second conductive line layer 112 is polysilicon, metal, metal silicide, or a combination thereof, for example. A forming method thereof may be chemical vapor deposition. The metal silicide may be tungsten silicide or cobalt silicide, nickel silicide, titanium silicide, copper silicide, molybdenum silicide, tantalum silicide, erbium silicide, zirconium silicide, or platinum silicide, for example.

Figure 1G:
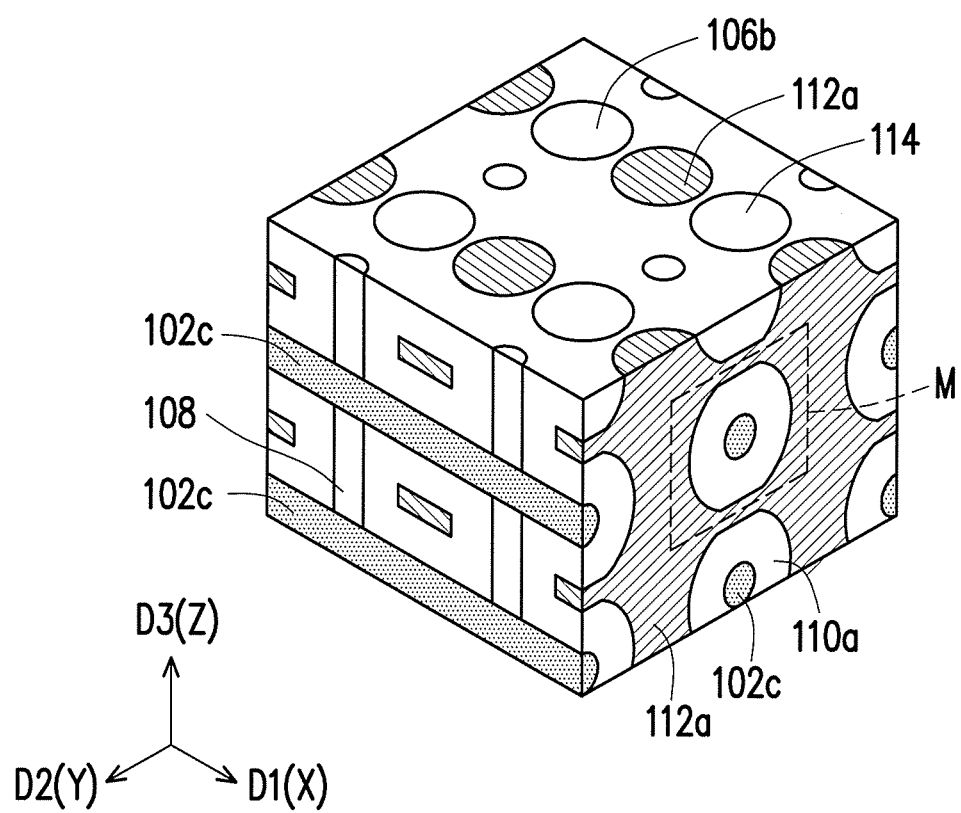

With reference to FIG. 1G, a plurality of dielectric pillars 114 are formed in the stack layer 100. The dielectric pillars 114 extend in the third direction D3 (e.g., the Z-axis direction). Meanwhile, in an embodiment, each of the second conductive line layers 112a insulated by the dielectric pillars 114 extends along a plane (e.g., a YZ plane) along the second direction D2 and the third direction D3. The second conductive line layers 112a and the dielectric pillars 114 are alternately disposed in the first direction D1 (e.g., the X-axis direction), so as to separate the rounded first conductive line layer 102b into a plurality of first conductive lines 102c. In an embodiment, the first direction D1, the second direction D2, and the third direction D3 are perpendicular to each other. The first conductive lines 102c extend in the first direction D1, and likewise, the charge storage layer 110a covering the surfaces of the first conductive lines 102c also extend in the first direction D1. A region where the second conductive line layer 112 surrounds a portion of the charge storage layer 110 around the corresponding first conductive line 102c is a memory cell M. It is known from the above that the support structures 108 support the adjacent upper and lower first conductive lines 102c, so as to prevent distortion and collapse of the three-dimensional memory device. In an embodiment, the memory device having the support structure of this embodiment is applicable to any three-dimensional or vertical type memory device.

FIG. 6A to FIG. 6D are schematic cross-sectional views along the line A-A of FIG. 1B.

In the following embodiments, same or similar elements, components, and layers are referred to by similar reference numerals. For example, a patterned first conductive line layer 302a shown in FIG. 6A, a patterned first conductive line layer 302b shown in FIG. 6B, and the patterned first conductive line layer 102a shown in FIG. 1B are the same or similar components. A support material layer 304a shown in FIG. 6A, a support material layer 304b shown in FIG. 6B, and the support material layer 104a shown in FIG. 1B are the same or similar components. Thus, details in these respects are not reiterated in the following.

Figure 6A:
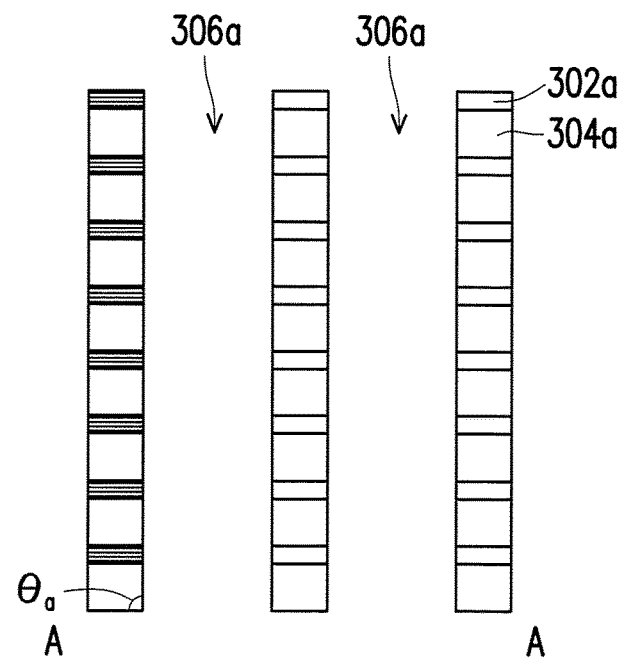
FIG. 6A to FIG. 6D are schematic cross-sectional views along the line A-A of FIG. 1B.
Figure 6B:
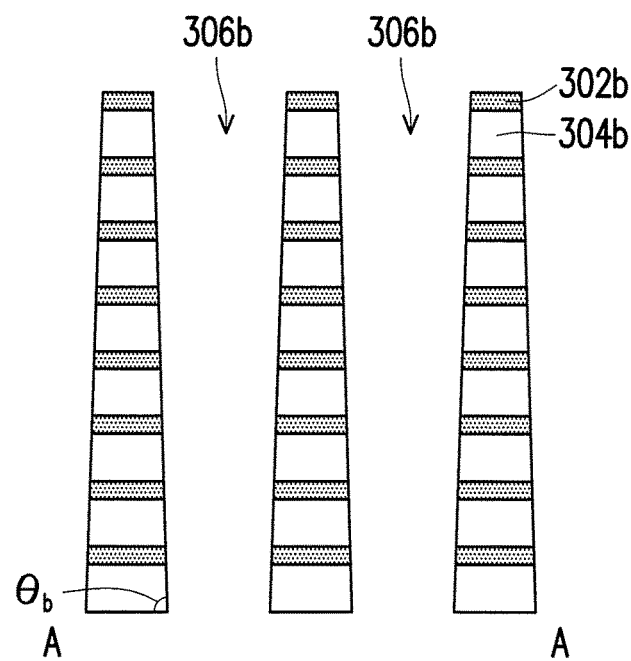
Figure 6C:
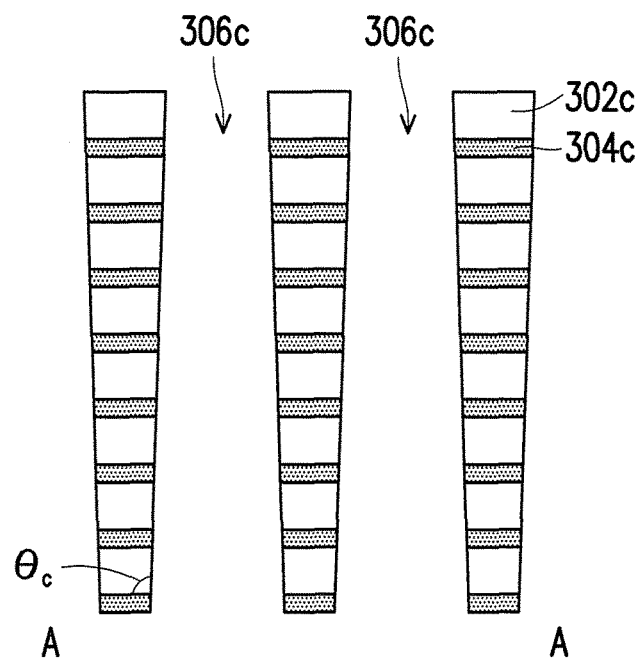
Figure 6D:
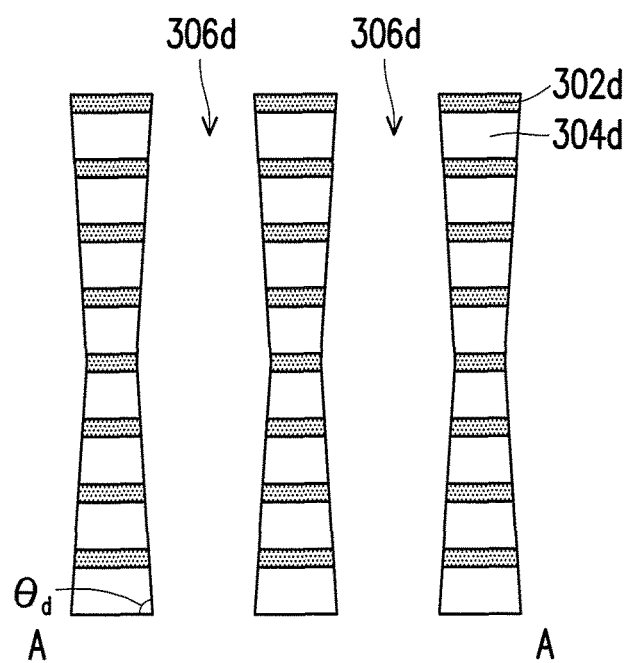

With reference to FIG. 1B, it should be noted that a shape of two sidewalls of the opening may differ due to the adjustment of the etching parameters when the patterning process is performed on a high aspect ratio structure. As shown in FIG. 6A, the shape of the two sidewalls of an opening 306a is rectangular, and an angle $\theta_a$ thereof is 90 degrees. As shown in FIG. 6B, the shape of the two sidewalls of an opening 306b is inverted trapezoidal, and an angle $\theta_b$ thereof is in a range of 80 degrees to 90 degrees. As shown in FIG. 6C, the shape of the two sidewalls of an opening 306c is trapezoidal, and an angle $\theta_c$ thereof is in a range of 90 degrees to 95 degrees. As shown in FIG. 6D, the shape of the two sidewalls of an opening 306d is bow-like, and an angle $\theta_{d1}$ thereof is in a range of 90 degrees to 95 degrees while an angle $\theta_{d2}$ thereof is in a range of 80 degrees to 90 degrees. To more clearly show the technical features of the embodiment of the invention, FIG. 6A to FIG. 6D respectively illustrate eight first conductive line layers 102 and eight support material layers 104. However, it is noted that the relative positions thereof are as shown in the schematic cross-sectional view along the line A-A of FIG. 1B. In other words, the two first conductive line layers 102 and two support material layers 104 of FIG. 1B may have similar technical features.

Figure 5A:
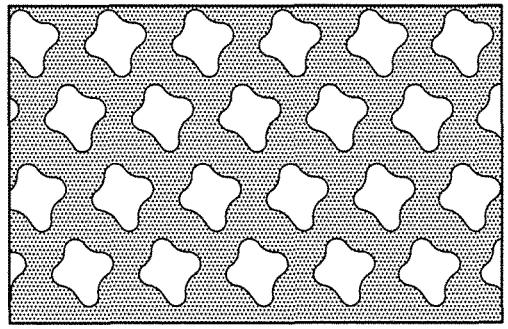
FIG. 5A to FIG. 5H are schematic views showing the shapes of openings of FIG. 1B.
Figure 5B:
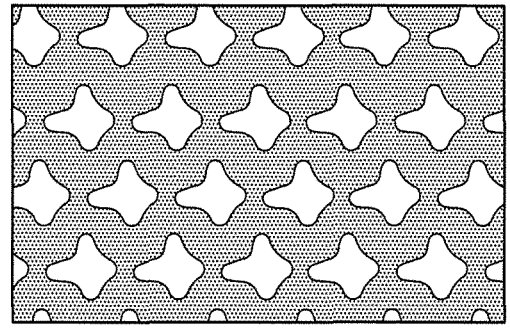
Figure 5C:
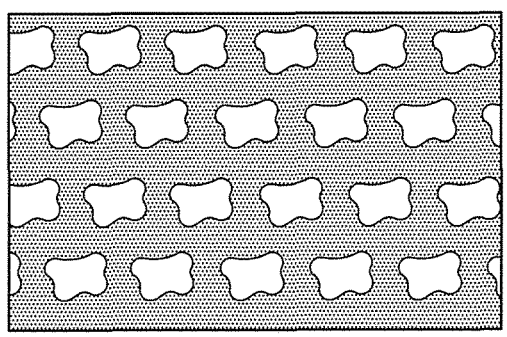
Figure 5D:
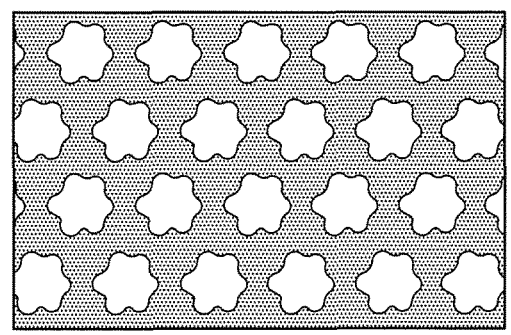
Figure 5E:
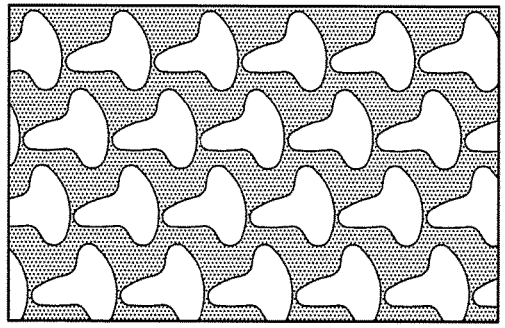
Figure 5F:
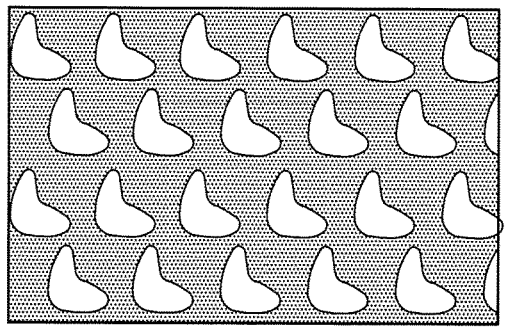
Figure 5G:
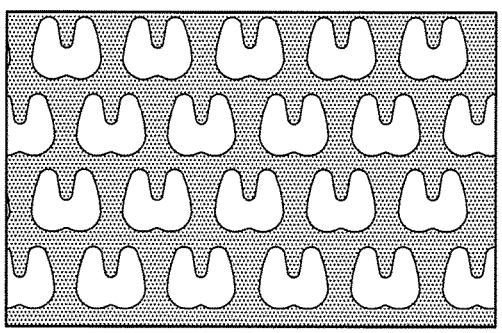
Figure 5H:
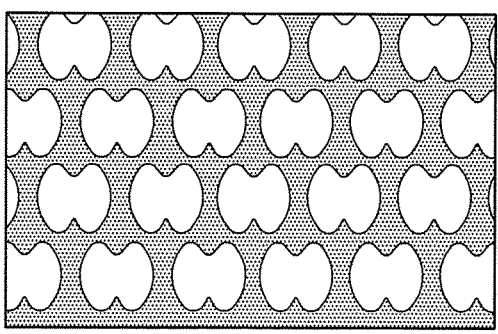
Figure 9A:
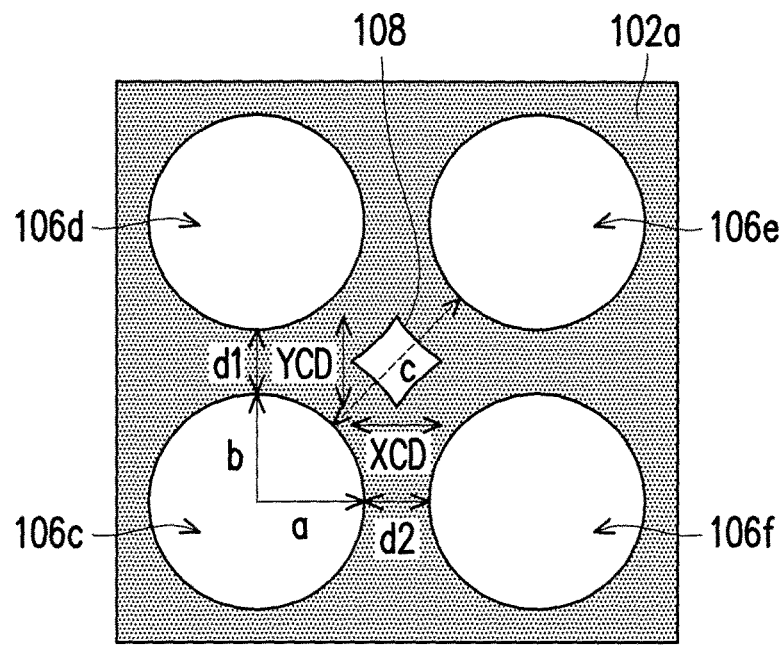
FIG. 9A to FIG. 9X are schematic top views showing the shapes of the openings according to an embodiment of the invention.
Figure 9B:
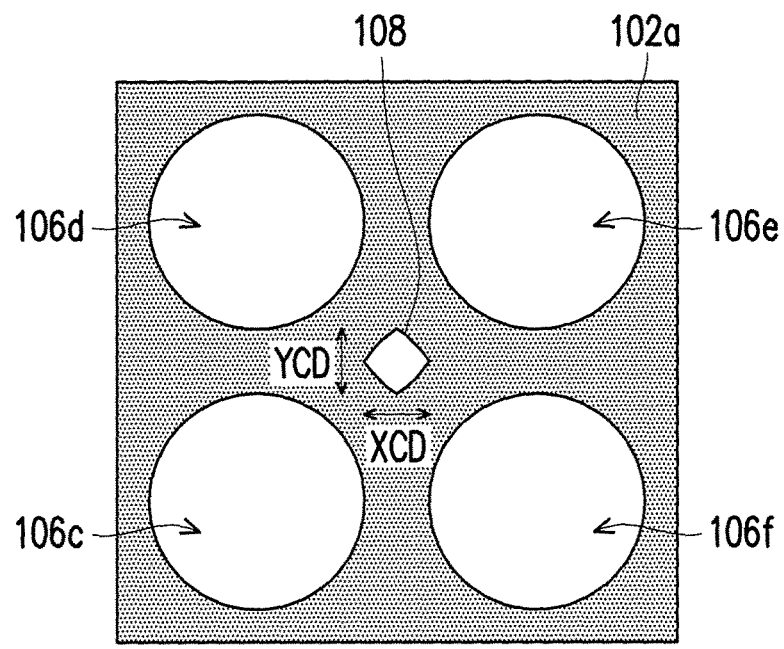
Figure 9C:
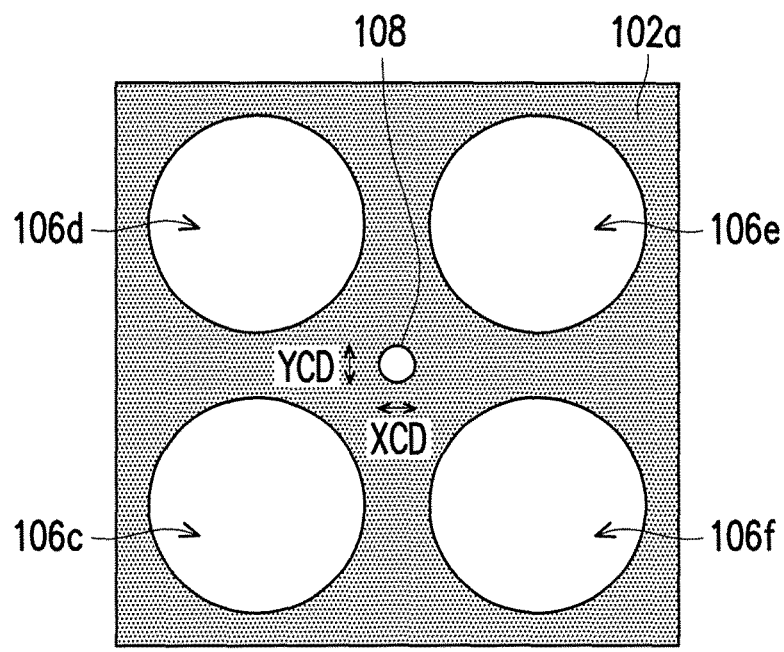
Figure 9D:
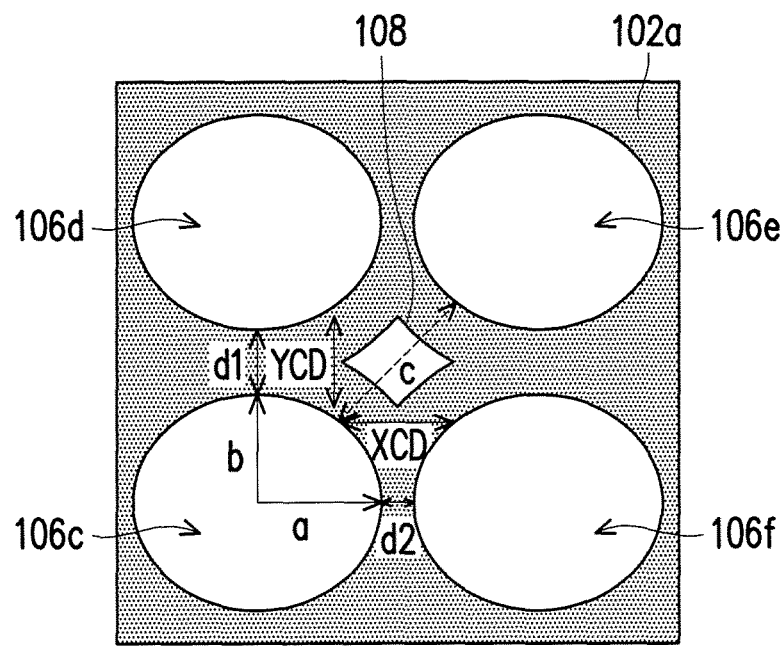
Figure 9E:
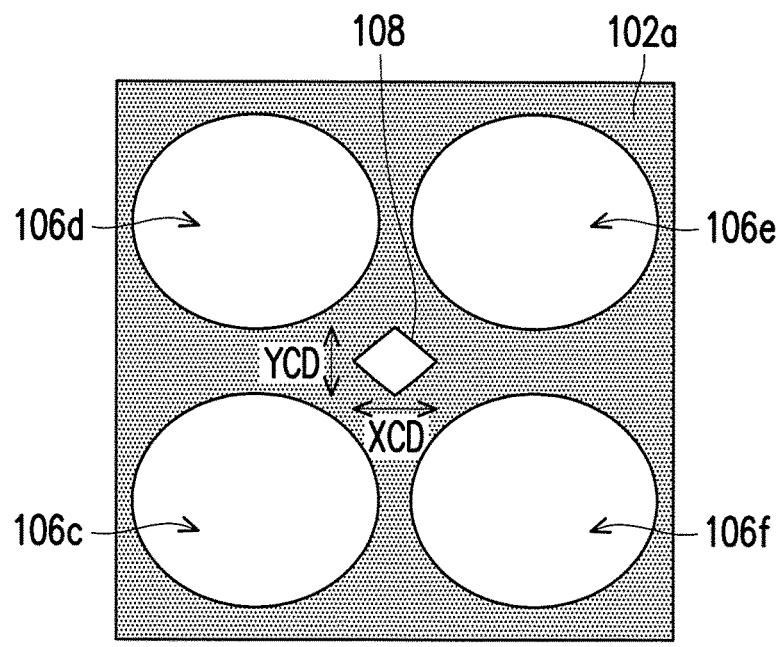
Figure 9F:
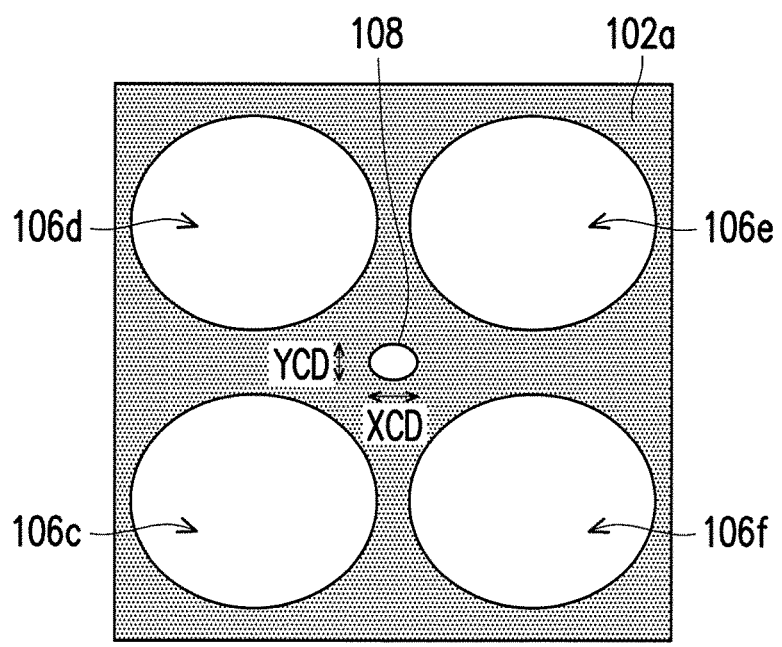
Figure 9G:
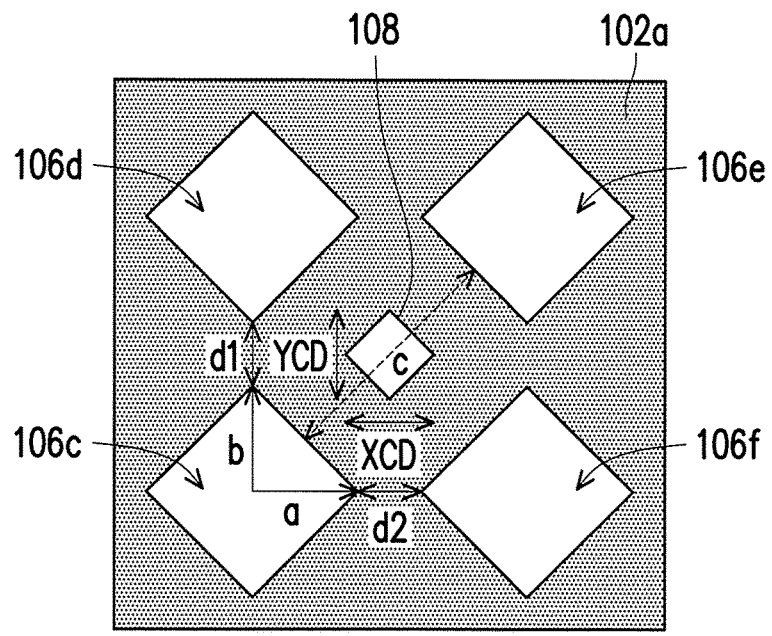
Figure 9H:
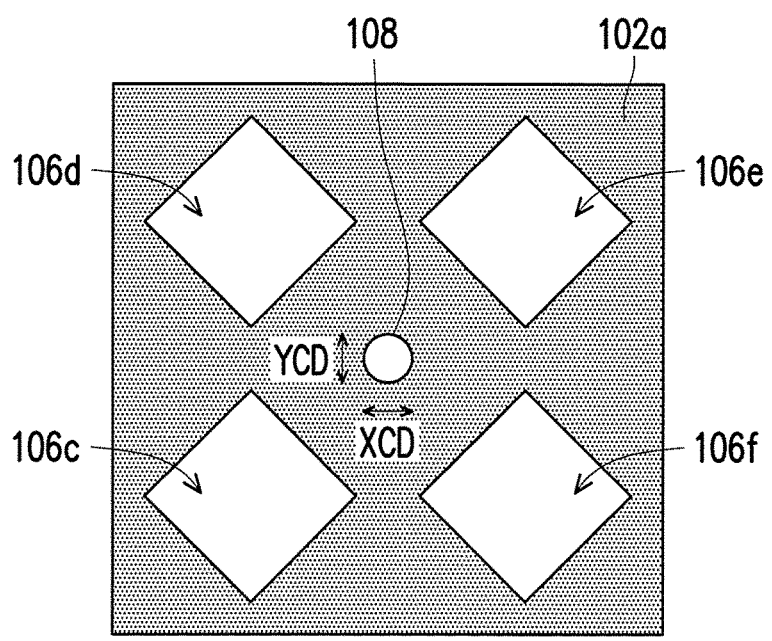
Figure 9I:
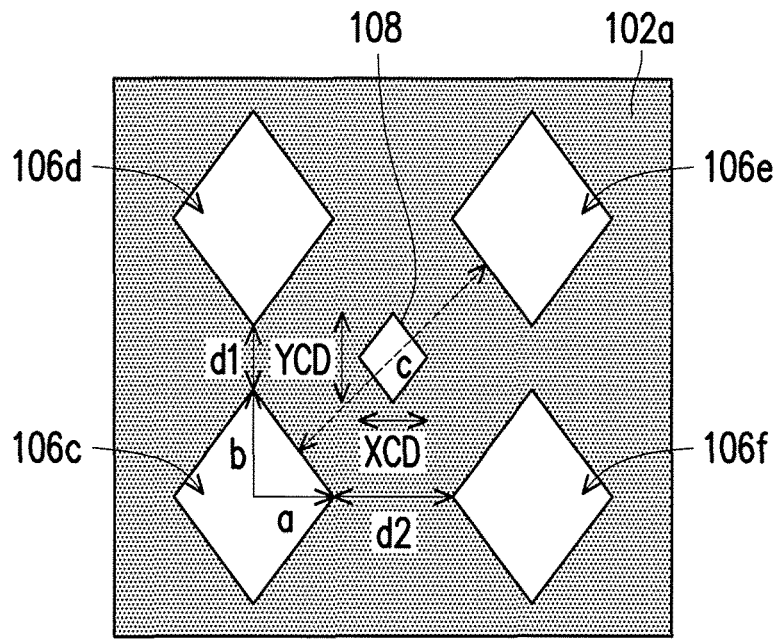
Figure 9J:
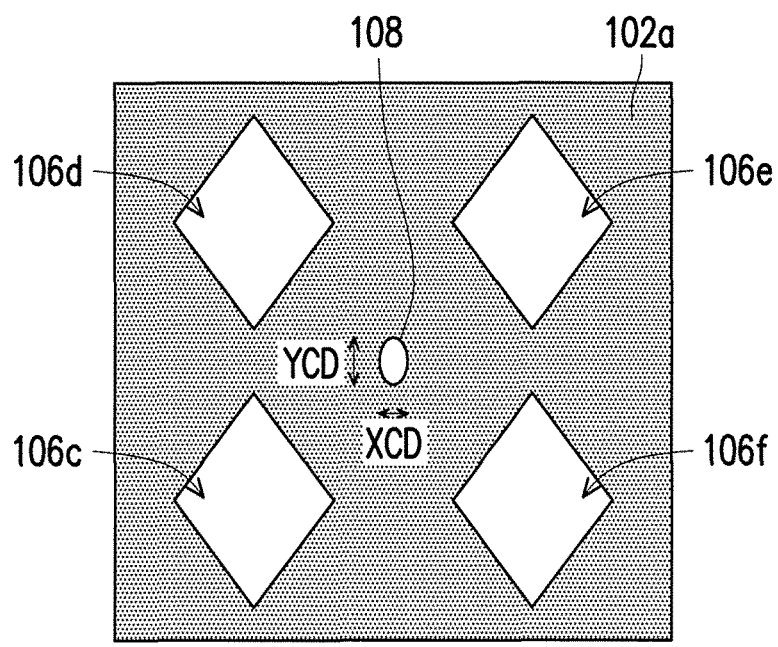
Figure 9K:
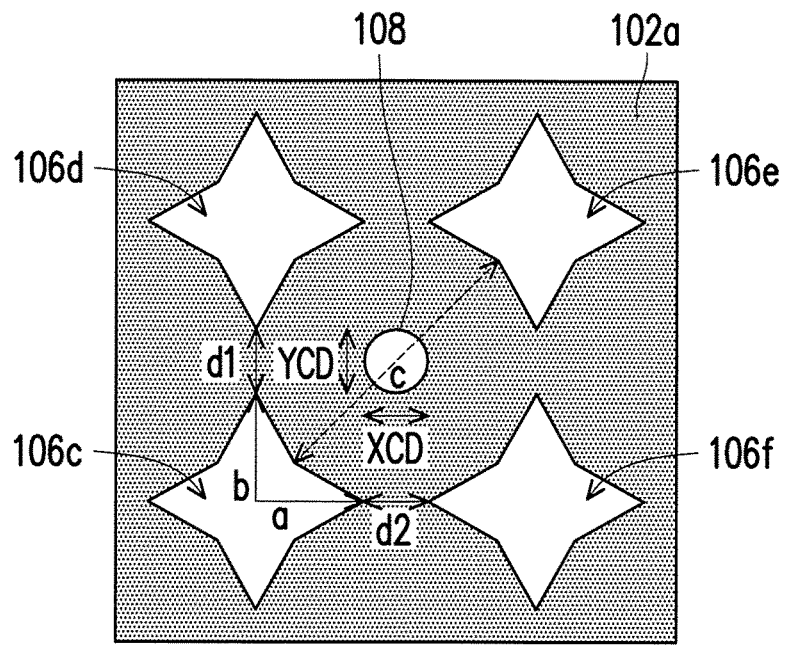
Figure 9L:
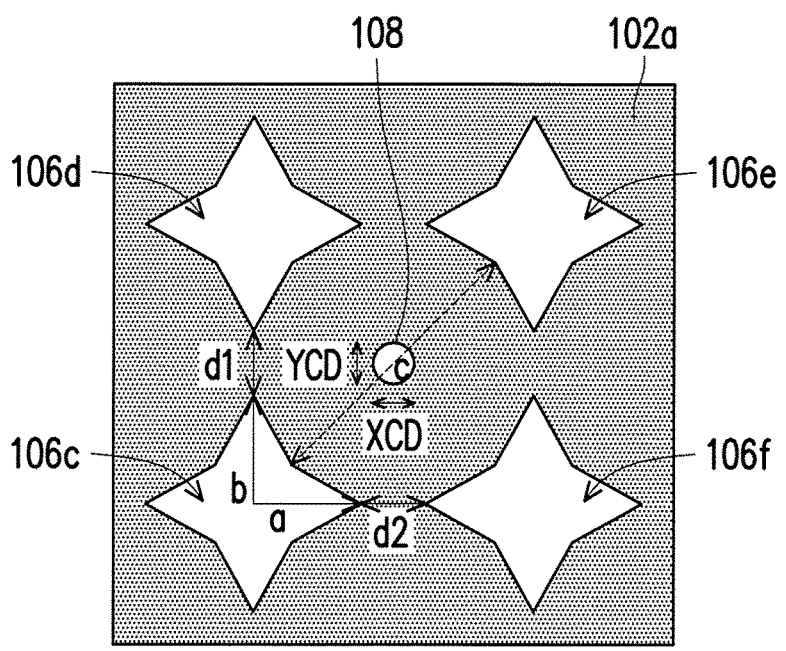
Figure 9M:
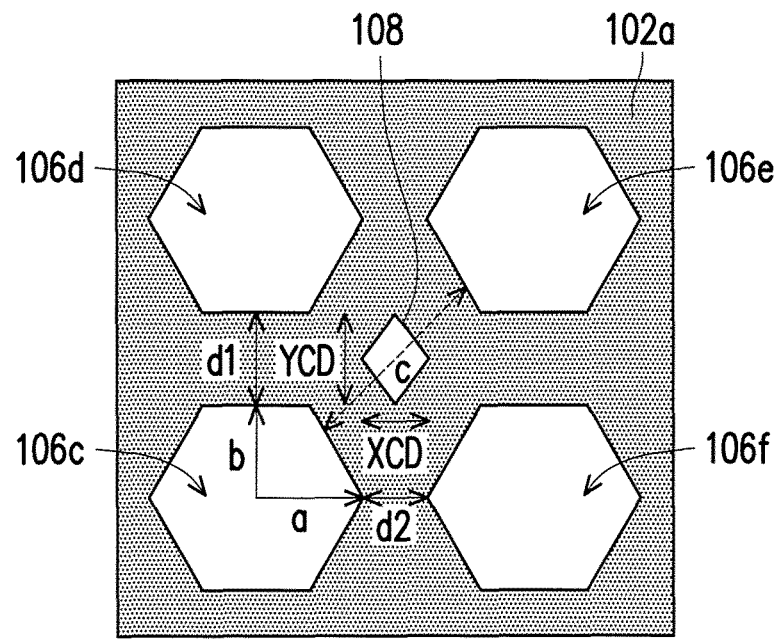
Figure 9N:
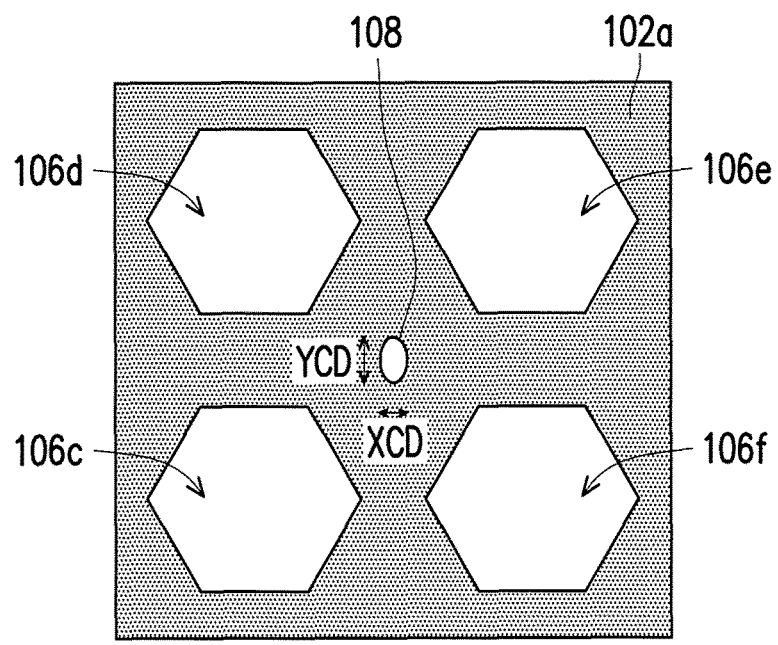
Figure 9O:
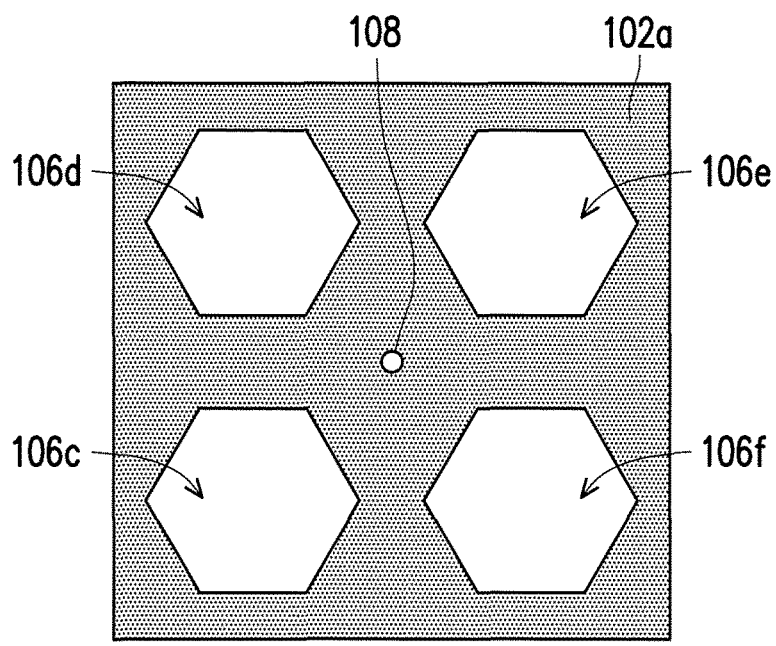

Moreover, from the perspective of the top view, the shape of the opening 106 includes: circle (as shown in FIG. 9A to FIG. 9C), ellipse (as shown in FIG. 9D to FIG. 9F), square (as shown in FIG. 9G to FIG. 9H), rhombus (as shown in FIG. 9I to FIG. 9J), star shape (as shown in FIG. 9K to FIG. 9L), hexagon (as shown in FIG. 9M to FIG. 9O), mushroom shape (as shown in FIG. 5E), heart shape (as shown in FIG. 5F), double-peak shape (as shown in FIG. 5G), bowknot shape (as shown in FIG. 5H), or a combination thereof. The invention is not intended to limit the shape of the opening 106 as long as the shape (as shown in FIG. 5A to FIG. 5D, for example) can be designed by the current lithography process. The shape and arrangement of the openings 106 are highly relevant to the shape of the support structures 108 that are formed in the subsequent processes, which is explained in detail in the following paragraphs.

In addition, in a condition of the optimal etching uniformity, a removal amount $X_1$ of the topmost patterned support material layer 104a (i.e., the support structure 108) and a removal amount $X_n$ of the bottommost patterned support material layer 104a (i.e., the support structure 108) in FIG. 1B should be the same. However, for a structure that has a higher aspect ratio, it is more difficult to achieve the optimal etching uniformity. An equation representing the aspect ratio uniformity (AR uniformity) is provided below:

$$AR\ Uniformity = \frac{X_1 - X_n}{(X_1 + X_2 + ... + X_n)/n} \times 100\%$$

wherein, $X_1$=the removal amount of the topmost patterned support material layer 104a.

$X_n$=the removal amount of the bottommost patterned support material layer 104a.

Therefore, after performing the corresponding etching process, the cross-sectional view along the line B-B of FIG. 1C may be illustrated by FIG. 7A to FIG. 7D.

In this embodiment, the etching process includes dry etching, wet etching, or a combination thereof. As to the process steps, the invention is not intended to limit the sequence of the combination of the dry etching and wet etching processes. For example, wet etching may be performed after dry etching, and vice versa. Alternatively, the dry etching and wet etching may be performed simultaneously.

In an embodiment, the dry etching process may include chemical dry etching (CDE) or SICONI etching, for example. For example, if the first conductive line layer 102 is polysilicon and the support material layer 104 is silicon oxide, the chemical dry etching uses fluorine-based chemistry and oxygen as the etching gas for performing the etching process. An etching selectivity of the silicon oxide and the polysilicon may be controlled by the contents of the fluorine-based chemistry and oxygen. In an embodiment, an equivalence ratio of the fluorine-based chemistry and oxygen is in a range of 1 to 20, and the etching selectivity of the silicon oxide and the polysilicon is in a range of 2 to 20. In addition, the etching selectivity may be controlled by adjusting the etching parameters of the etching process. The etching parameters include adjustments of the content of a non-etching gas, etching chamber pressure, RF power, and etching time. If the etching selectivity of the silicon oxide and the polysilicon is in a range of 2 to 20, the content of the introduced helium may be in a range of 10 wt % to 25 wt %; the etching chamber pressure may be in a range of 5 mtorr to 100 mtorr; the RF power may be in a range of 200 W to 2000 W; and the etching time may be in a range of 60 seconds to 300 seconds, for example. The SICONI etching uses $NH_3$ and $NF_3$ as the etching gas for performing the etching process. If a ratio of $NH_3$ and $NF_3$ is in a range of 0.5 to 3, the etching selectivity of the silicon oxide and the polysilicon is equal to or greater than 10. If the etching chamber pressure is in a range of 1 torr to 5 torr; the RF power is in a range of 10 W to 50 W; and the etching time of each cycle is in a range of 5 seconds to 50 seconds when the number of the patterned support material layers 104a is 8, the AR uniformity of the aforementioned aspect ratio (eight layers) is in a range of 0% to 10%. Thus, the AR uniformity is improved, and the critical dimension (CD) of the support structure 108 between the patterned first conductive line layers 102a is maintained.

Furthermore, the wet etching process may use fluorine-based chemistry in solution form for performing the etching process. The concentration of the fluorine-based chemistry needs to be equal to or less than 1 wt %, so as to achieve favorable AR uniformity. In an embodiment, when the number of the patterned support material layers 104a is greater than 8, the AR uniformity is equal to or less than 10%.

Figure 7A:
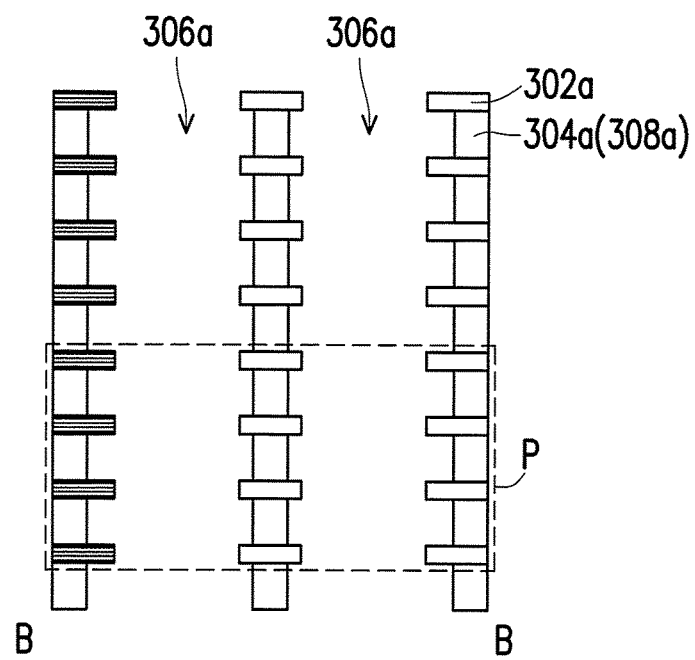
FIG. 7A to FIG. 7D are schematic cross-sectional views along the line B-B of FIG. 1C.
Figure 7B:
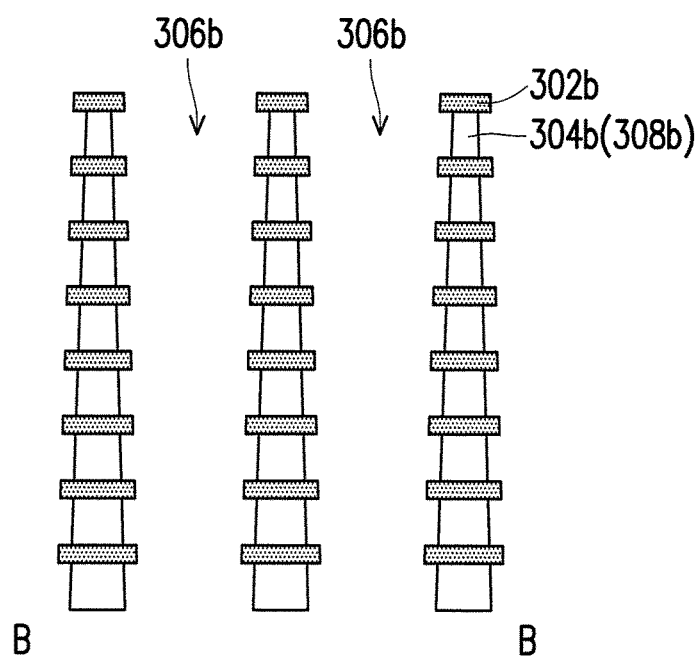
Figure 7C:
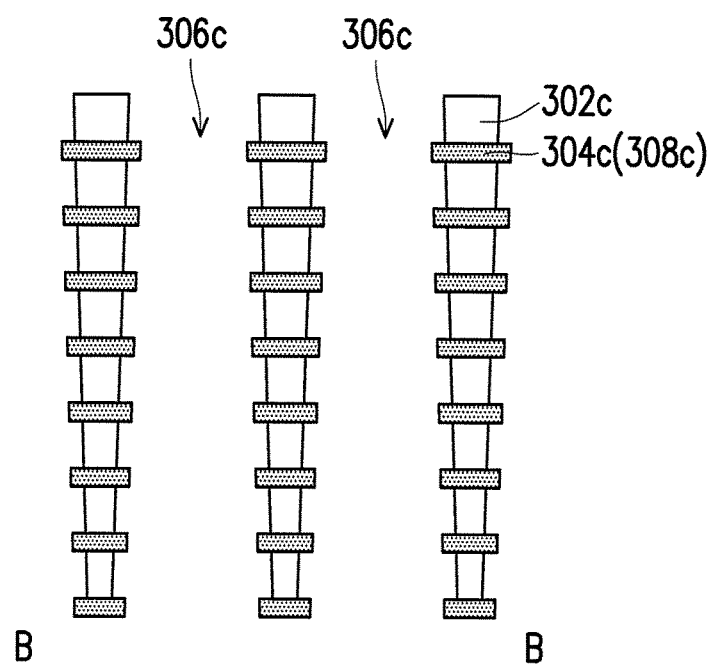
Figure 7D:
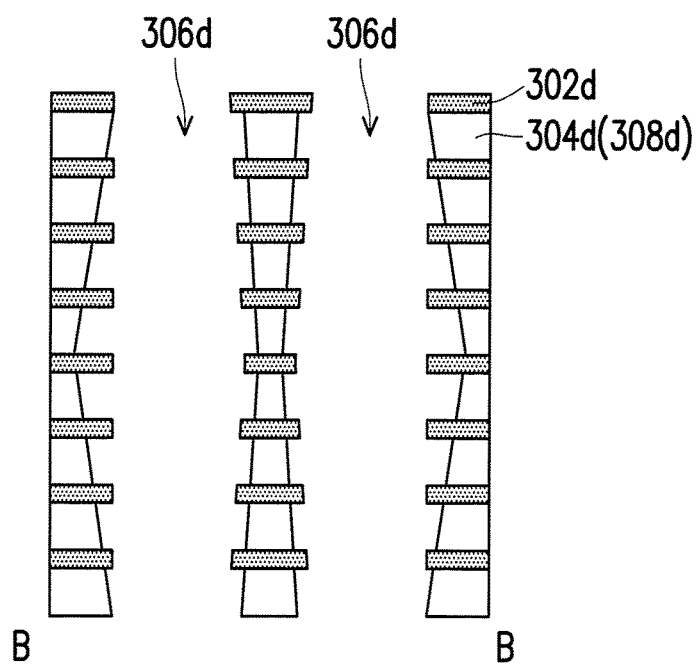
Figure 8A:
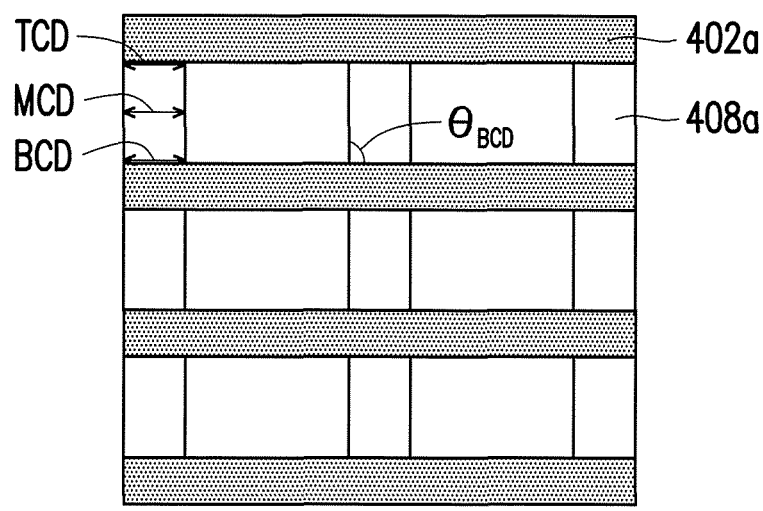
FIG. 8A to FIG. 8F are schematic cross-sectional views of a portion P of FIG. 7A.

In the following embodiments, same or similar elements, components, and layers are referred to by similar reference numerals. For example, the patterned first conductive line layer 302a shown in FIG. 7A and a patterned first conductive line layer 402a shown in FIG. 8A are the same or similar components. The support material layer 304a (i.e., the support structure 308a) shown in FIG. 7A and a support structure 408a shown in FIG. 7A are the same or similar components. Thus, details in these respects are not reiterated in the following.

Figure 8B:
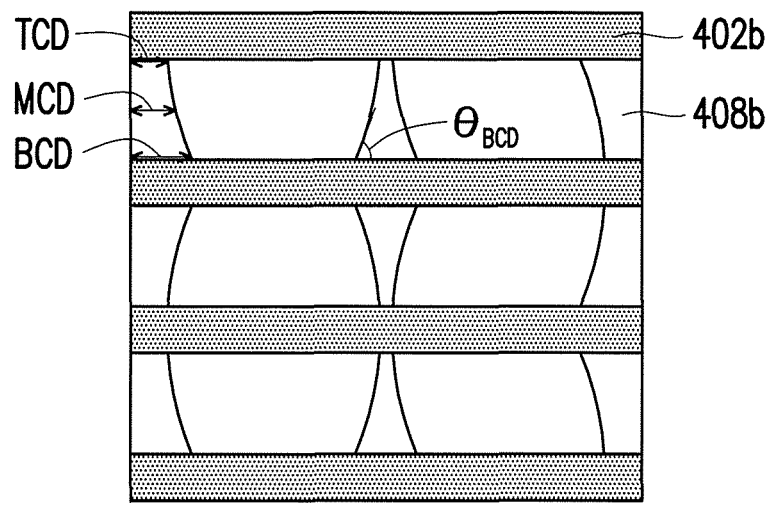
Figure 8C:
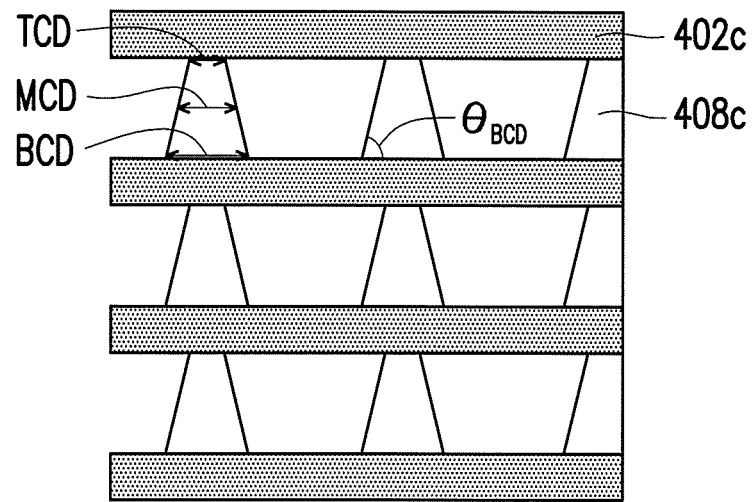
Figure 8D:
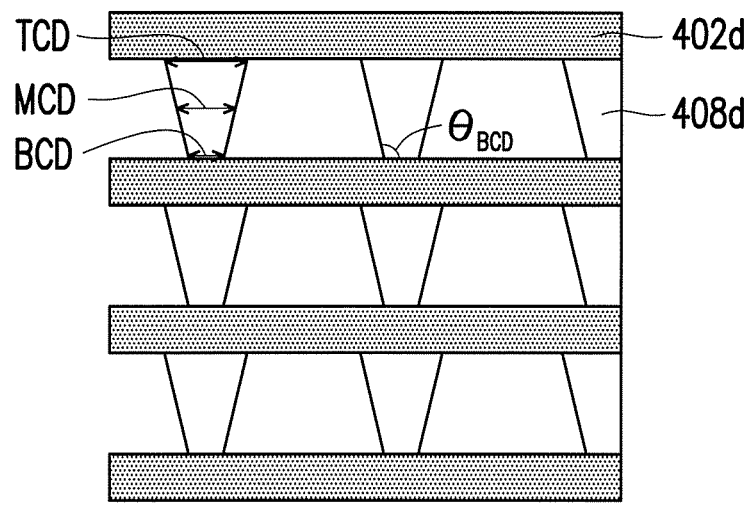
Figure 8E:
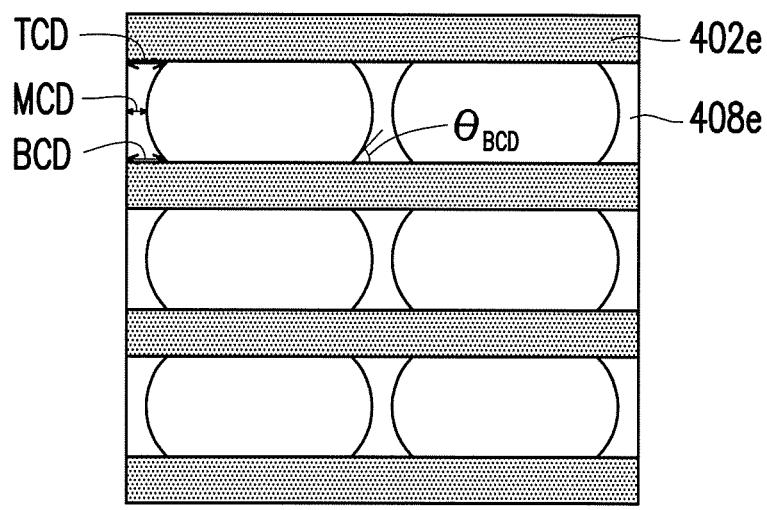
Figure 8F:
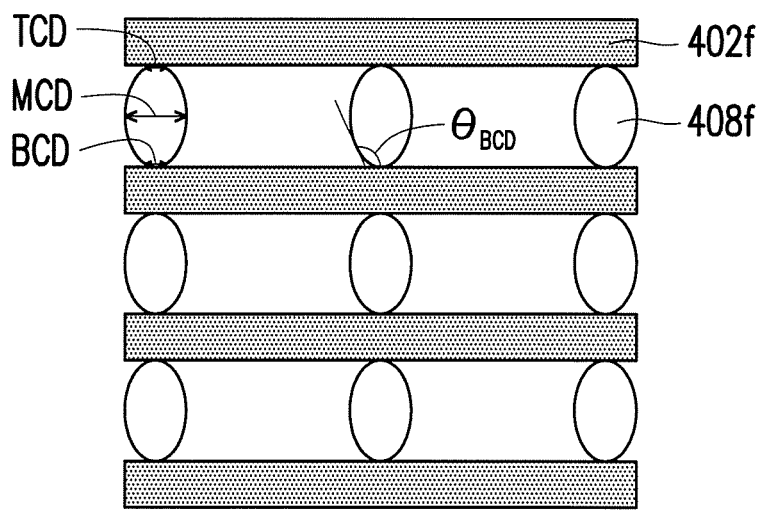

Moreover, by using different etching processes, the support structure 108 may be formed into a pillar structure, and two sidewalls of the pillar structure may have various profiles, such as rectangle, irregular shape, trapezoid, inverted trapezoid, hourglass shape, egg shape (as shown in FIG. 8A to FIG. 8F), or a combination thereof, for example. For example, when the dry etching process is performed, the profile of the two sidewalls of a support structure 408f has an egg shape (as shown in FIG. 8F). When the wet etching process is performed, the profile of the two sidewalls of a support structure 408e has a hourglass shape (as shown in FIG. 8E). When the dry etching process and the wet etching process are performed, the profile of the two sidewalls of a support structure 408a is rectangular (as shown in FIG. 8A). The critical dimensions of the various profiles of the two sidewalls of the support structure 108 are indicated in the following Table 1.

FIG. 8A to FIG. 8F are schematic cross-sectional views of a portion P of FIG. 7A.

As shown in FIG. 8A to FIG. 8F, TCD represents the critical dimension of top portions of the two sidewalls of the support structure, MCD represents the critical dimension of middle portions of the two sidewalls of the support structure, BCD represents the critical dimension of bottom portions of the two sidewalls of the support structure, and $\theta_{BCD}$ is the angle between the bottom portions of the two sidewalls of the support structure and the first conductive line layer. As shown in FIG. 8A, if the profile of the two sidewalls of the support structure 408a is rectangular, TCD=MCD=BCD. As shown in FIG. 8B, if the profile of the two sidewalls of the support structure 408b has an irregular shape, TCD>MCD>BCD. As shown in FIG. 8C, if the profile of the two sidewalls of the support structure 408c is a trapezoid, TCD<MCD<BCD. As shown in FIG. 8D, if the profile of the two sidewalls of the support structure 408d is an inverted trapezoid, TCD>MCD>BCD. As shown in FIG. 8E, if the profile of the two sidewalls of the support structure 408e has a hourglass shape, MCD<TCD and MCD<BCD. As shown in FIG. 8F, if the profile of the two sidewalls of the support structure 408f has an egg shape, MCD>TCD and MCD>BCD.

Figure 9P:
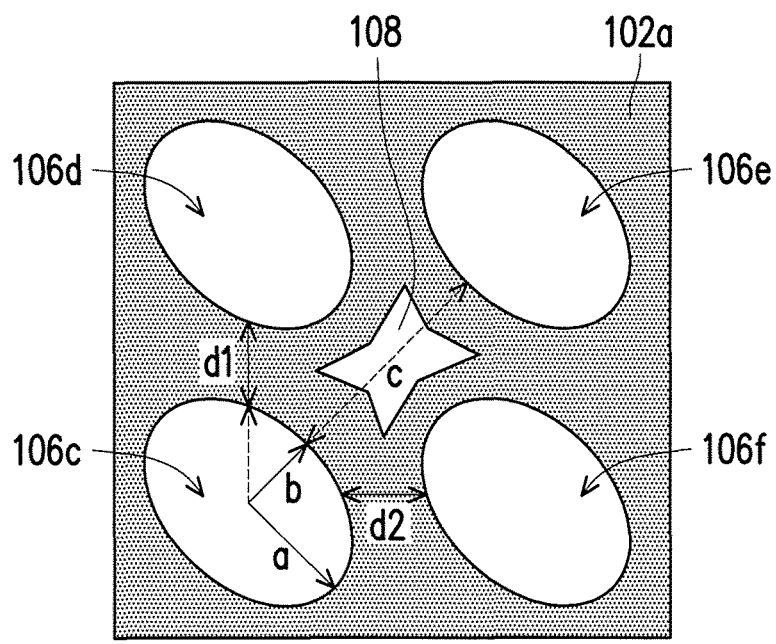
Figure 9Q:
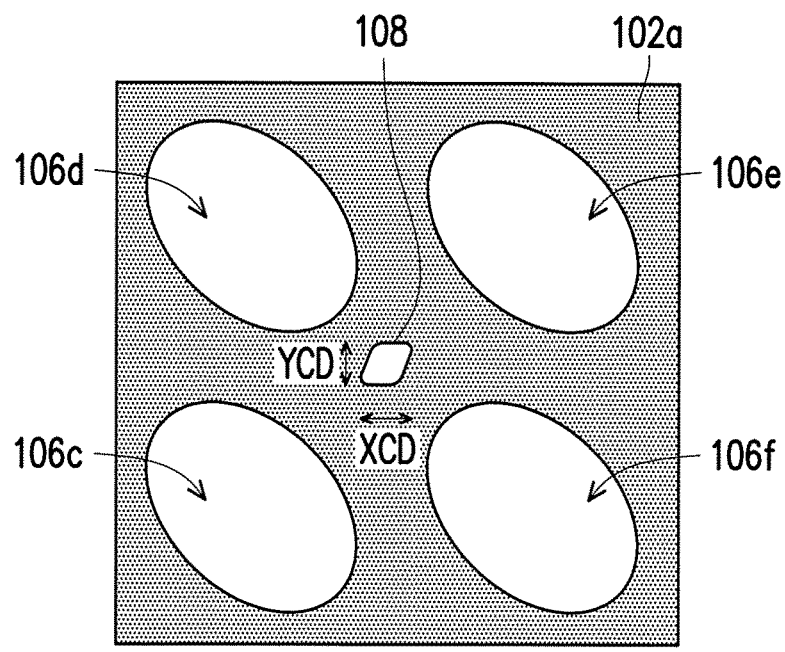
Figure 9R:
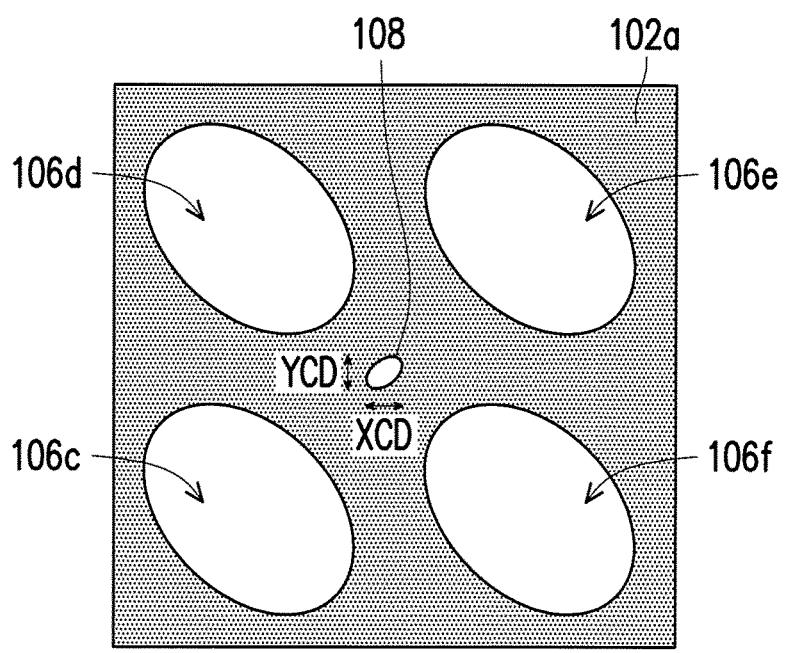
Figure 9S:
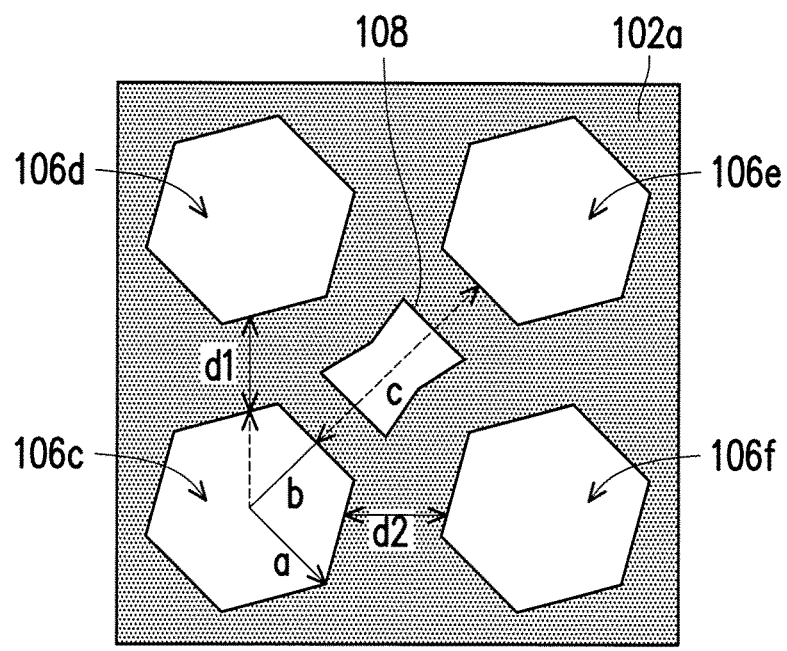
Figure 9T:
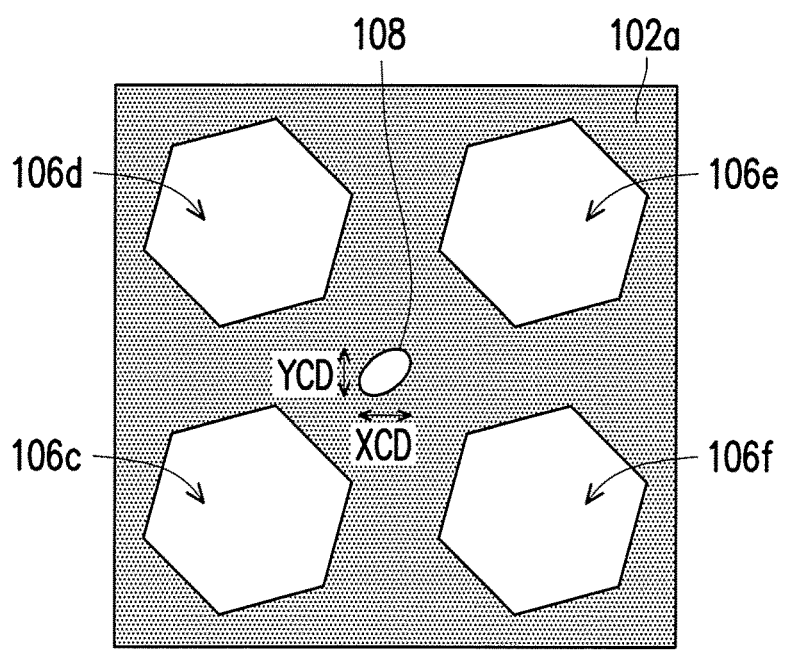
Figure 9U:
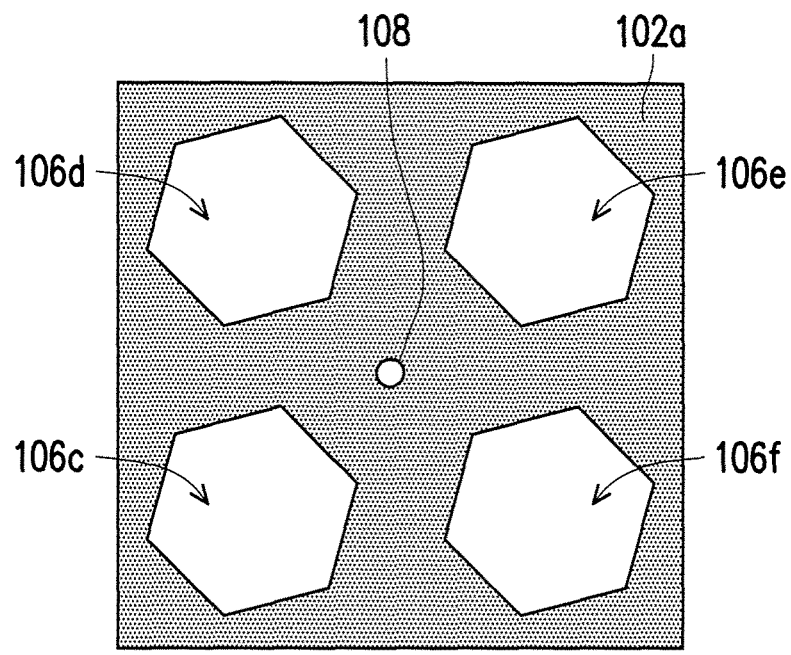
Figure 9V:
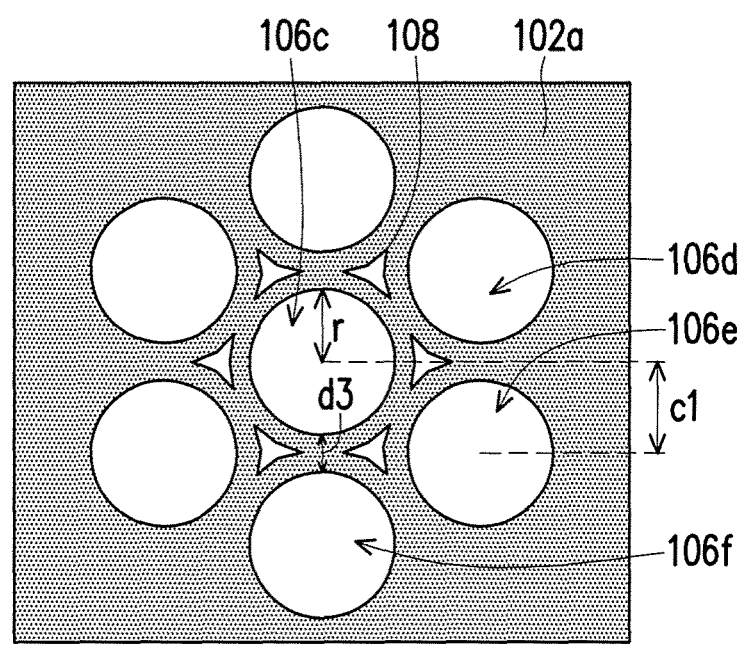
Figure 9W:
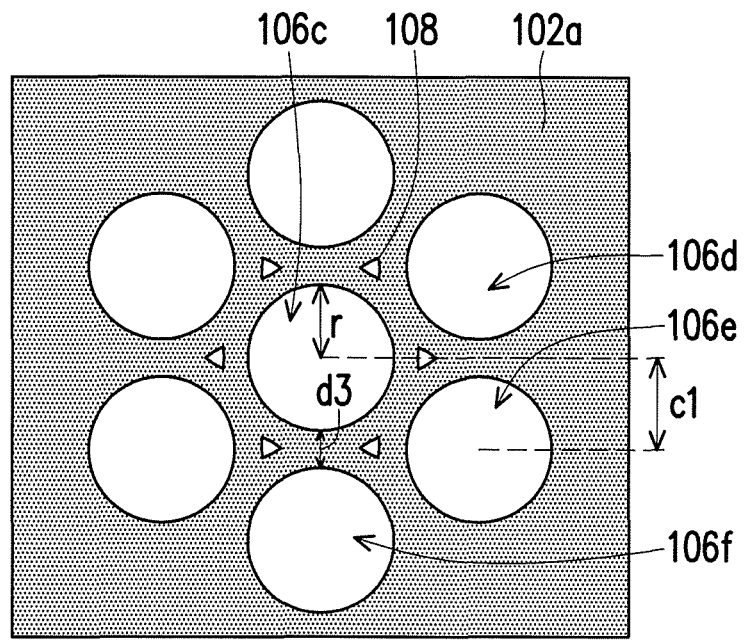
Figure 9X:
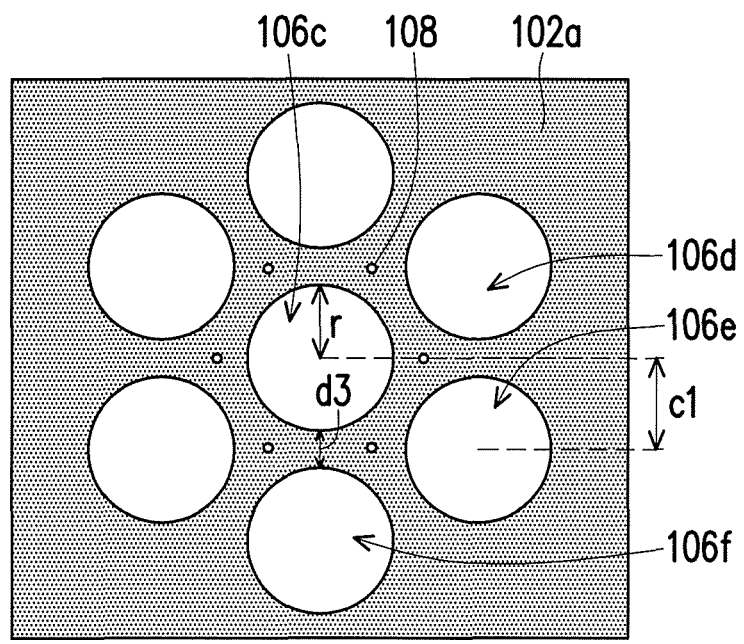

FIG. 9A to FIG. 9X are schematic top views showing the shapes of the openings according to an embodiment of the invention.

From the perspective of the top view, as shown in FIG. 9A to FIG. 9X, the openings 106c to 106f may be arranged in an array, and the support structure 108 is located between the adjacent four openings 106c to 106f. The shape of the support structure 108 includes: circle, ellipse, square, star shape, heart shape, mushroom shape, double-peak shape, bowknot shape, or a combination thereof. As described in the foregoing paragraphs, the shape of the support structure 108 is relevant to the shape and arrangement of the openings 106c to 106f. For example, if the shape of the openings 106c to 160f are circular and arranged in an array, as the etching time increases, the shape of the support structure 108 changes from the star shape (as shown in FIG. 9A) to rounded square (as shown in FIG. 9B), and then to circle (as shown in FIG. 9C). If the shapes of the openings 106c to 160f are elliptical and are arranged in an array, as the etching time increases, the shape of the support structure 108 changes from the star shape (as shown in FIG. 9D) to rhombus (as shown in FIG. 9E), and then to ellipse (as shown in FIG. 9F). However, the invention is not limited thereto, in other embodiments, when the openings 106c to 106f are elliptical, hexagonal, or polygonal, the shape of the support structure 108 formed accordingly also changes (as shown in FIG. 9G to FIG. 9H; FIG. 9I to FIG. 9J; FIG. 9K to FIG. 9L; and FIG. 9M to FIG. 9O). Normally, as the etching time increases, the shape of the support structure 108 formed accordingly becomes more similar to a curved shape and the support structure 108 has a smaller area. Moreover, if the shape of the openings 106c to 106f are elliptical, hexagonal, or polygonal, and a rotation angle θ thereof is in a range of 0 degree to 45 degrees, the shape and angle of the formed support structure 108 also change accordingly (as shown in FIG. 9P to FIG. 9R; and FIG. 9S to FIG. 9U).

As shown in FIG. 9A to FIG. 9U, a represents the distance between the centroid the opening 106c and a side thereof (in the X-axis direction), b represents the distance between the centroid of the opening 106c and a side thereof (in the Y-axis direction), c represents the distance between the opening 106c and another opening 106e in the diagonal direction, d1 represents the distance between the opening 106c and another opening 106d in the Y-axis direction, d2 represents the distance between the opening 106c and another opening 106f in the X-axis direction, θ represents the rotation angle of the openings 106c to 106f, XCD represents the critical dimension of the shape of the support structure in the X-axis direction, and YCD represents the critical dimension of the shape of the support structure in the Y-axis direction. If the shape of the openings 106c to 106f 106 is circular (as shown in FIG. 9A to FIG. 9C), a=b and d1=d2 or d1≠d2. If the shape of the openings 106c to 106f is elliptical (as shown in FIG. 9D to FIG. 9F), a≠b and d1=d2 or d1≠d2. If the shape of the openings 106c to 106f is rectangular (as shown in FIG. 9G to FIG. 9H), a=b and d1=d2 or d1≠d2; or a≠b and d1=d2 or d1≠d2. If the shape of the openings 106c to 106f is rhombic (as shown in FIG. 9I to FIG. 9J), a≠b and d1=d2 or d1≠d2; or a≠b and d1=d2 or d1≠d2. If the shape of the openings 106c to 106f is star-like (as shown in FIG. 9K to FIG. 9L), a=b and d1=d2 or d1≠d2; or a≠b, and d1=d2 or d1≠d2. If the shape of the openings 106c to 106f is hexagonal (as shown in FIG. 9M to FIG. 9O), a=b and d1=d2 or d1≠d2; or a≠b and d1=d2 or d1≠d2. If the shape of the openings 106c to 106f is elliptical (as shown in FIG. 9P to FIG. 9R) and has the rotation angle θ, a≠b and d1=d2 or d1≠d2. If the shape of the openings 106c to 106f is hexagonal (as shown in FIG. 9S to FIG. 9U) and has the rotation angle, a=b and d1=d2 or d1≠d2; or a≠b and d1=d2 or d1≠d2.

An example is provided below, wherein if the openings 106c to 106f have various shapes and are arranged in an array, as the etching time changes, the shape of the support structure 108 is indicated in the following Table 3. Table 3 is given as an example in this embodiment. However, it should be noted that the invention is not limited thereto. In other embodiments, the support structure 108 may have different shapes.

TABLE 1

| etching time | opening shape | | | | | |
|---|---|---|---|---|---|---|
| | circle | ellipse | square | rhombus | star | hexagon |
| short | star | star | square | rhombus | circle | square |
| middle | square | rhombus | circle | ellipse | circle | ellipse |
| long | circle | ellipse | circle | ellipse | circle | ellipse |

In addition, if the shape of the opening 106c to 106f is circular and the openings 106 are arranged in the closest manner, and the support structure 108 is located between adjacent three openings 106c to 106e, as the etching time increases, the shape of the support structure 108 changes from the star shape (as shown in FIG. 9V) to triangle (as shown in FIG. 9W), and then to circle (as shown in FIG. 9X). Referring to FIG. 9V, in an embodiment, the closest manner may be that c1<2r, r+d3 is a fixed value, and d3>10 nm, for example. In addition, r is the radius of the opening 106, c is the distance between the opening 106c and the opening 106e (e.g., the distance on the Y-axis), and d3 is the distance between the opening 106c and the opening 106f (e.g., the distance on the X-axis).

With reference to FIG. 8A to FIG. 8F and FIG. 9A to FIG. 9X, in the above embodiment, by controlling the etching process, the support structure 108 is formed into a pillar structure that may have different shapes. However, the embodiments of the invention are not limited thereto. By changing d1 and d2 and controlling the etching time, the formed support structure 108 may have a wave structure, a corrugated structure, and a sheet structure.

Figure 10A:
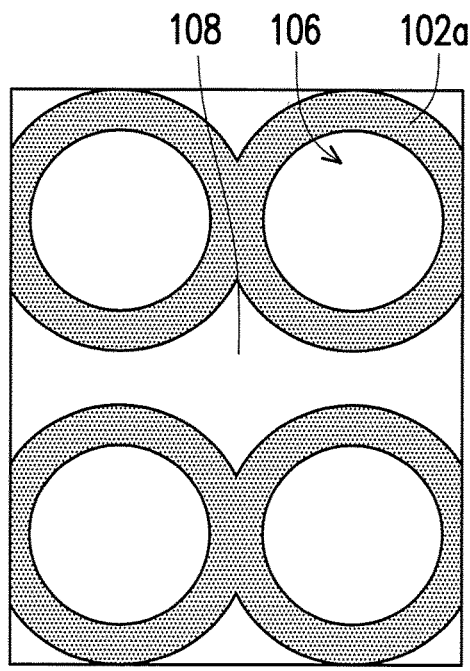
FIG. 10A to FIG. 10X are schematic top views of support structures according to an embodiment of the invention.
Figure 10B:
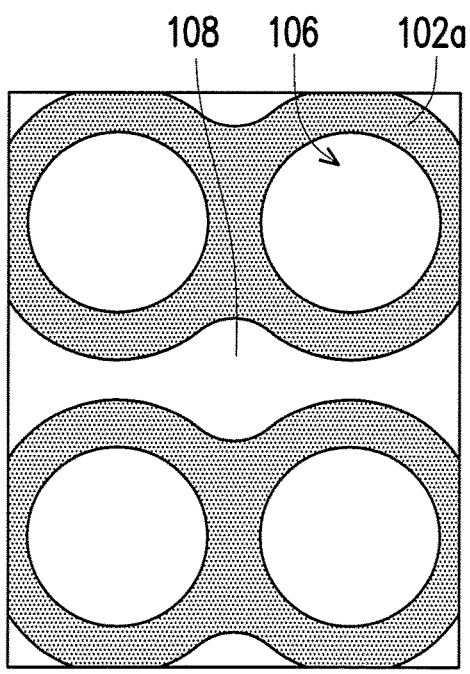
Figure 10C:
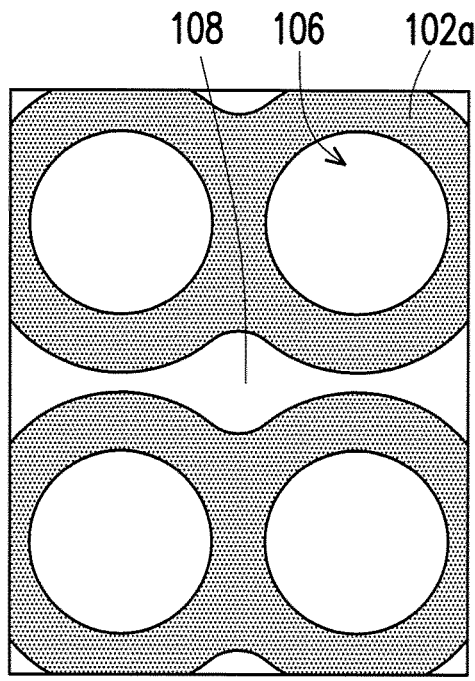
Figure 10D:
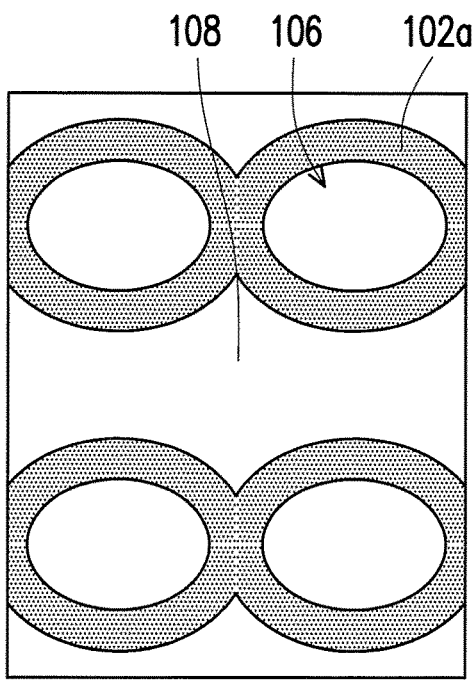
Figure 10E:
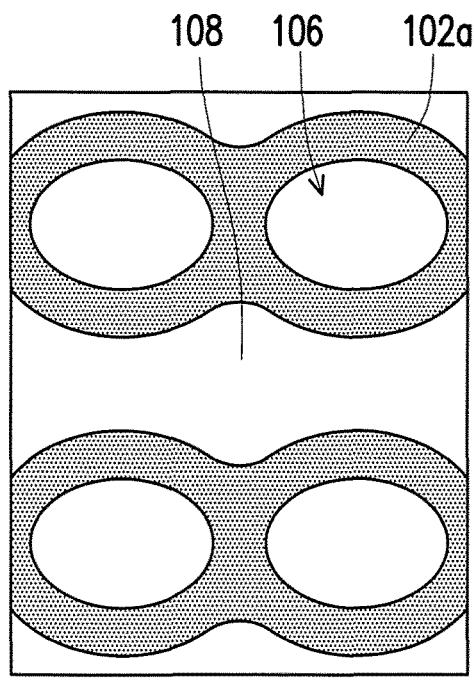
Figure 10F:
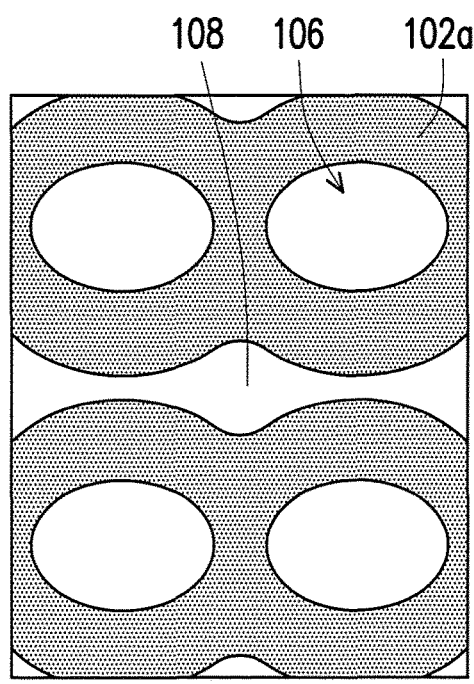
Figure 10G:
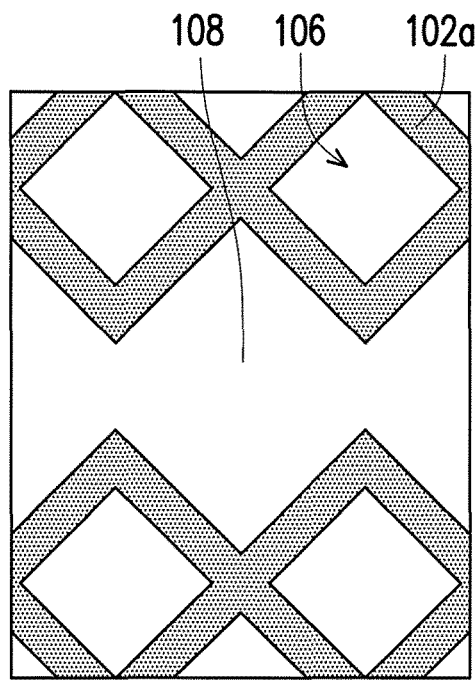
Figure 10H:
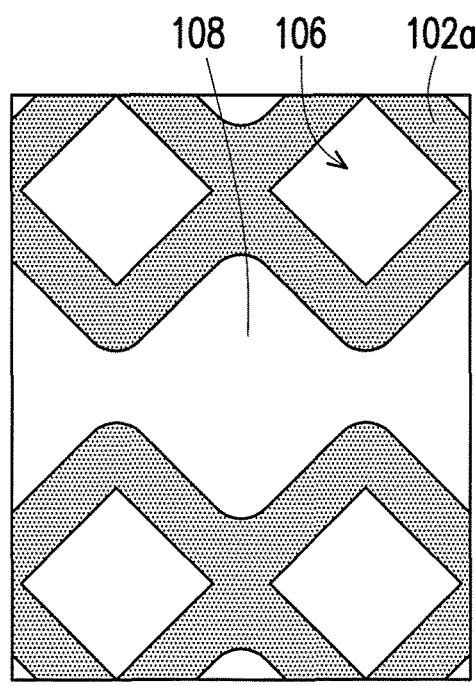
Figure 10I:
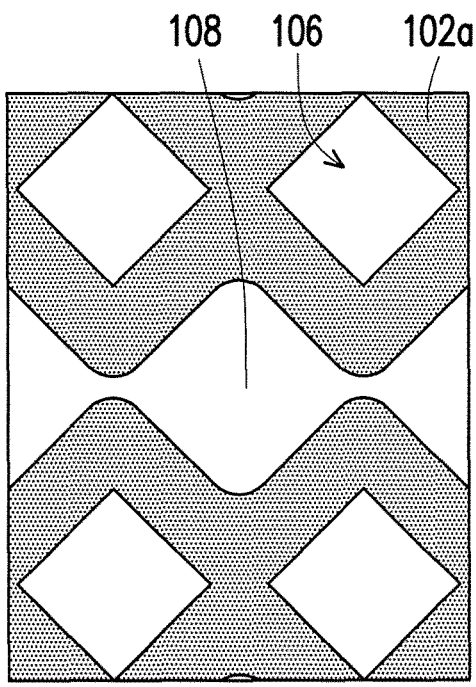
Figure 10J:
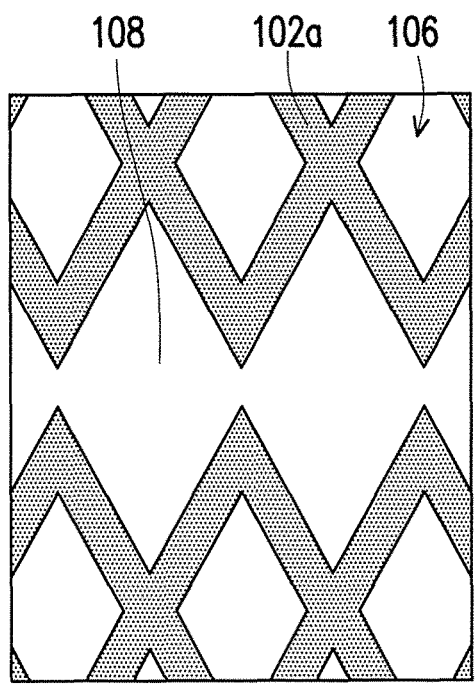
Figure 10K:
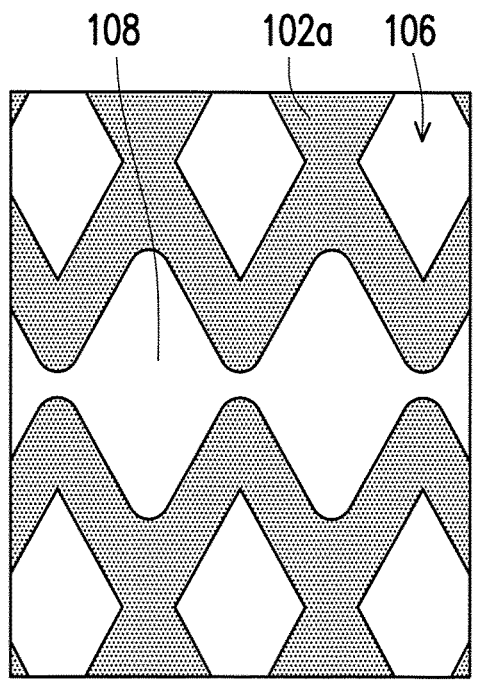
Figure 10L:
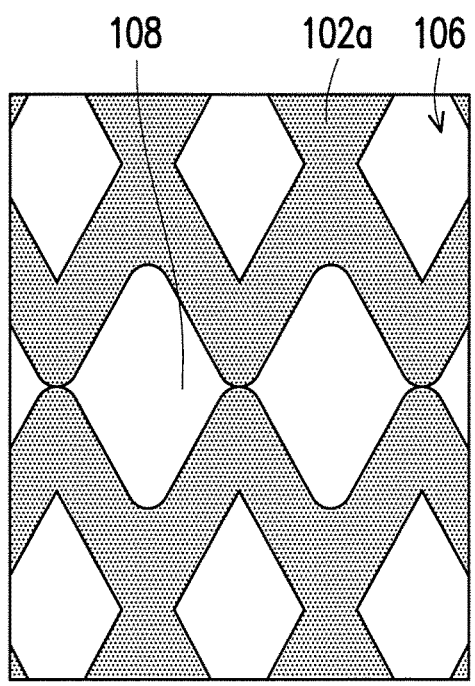
Figure 10M:
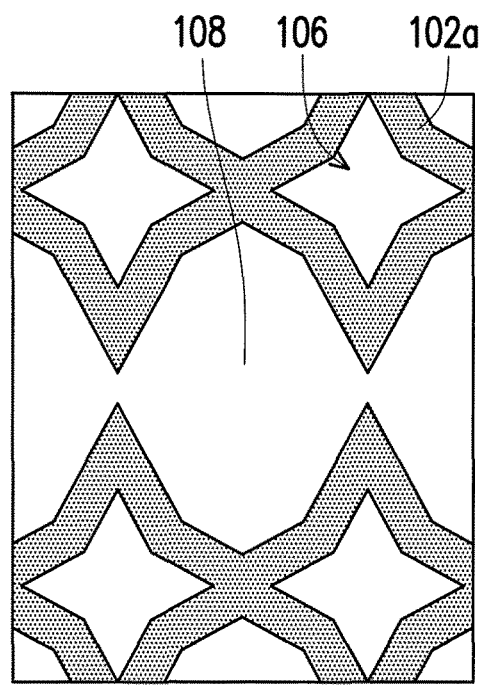
Figure 10N:
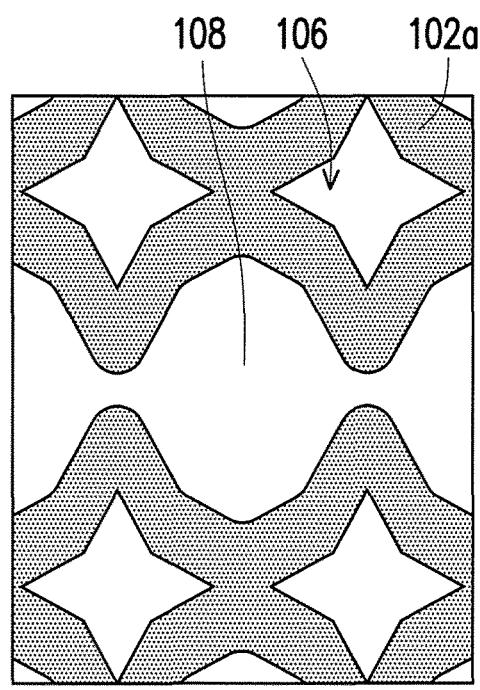
Figure 10O:
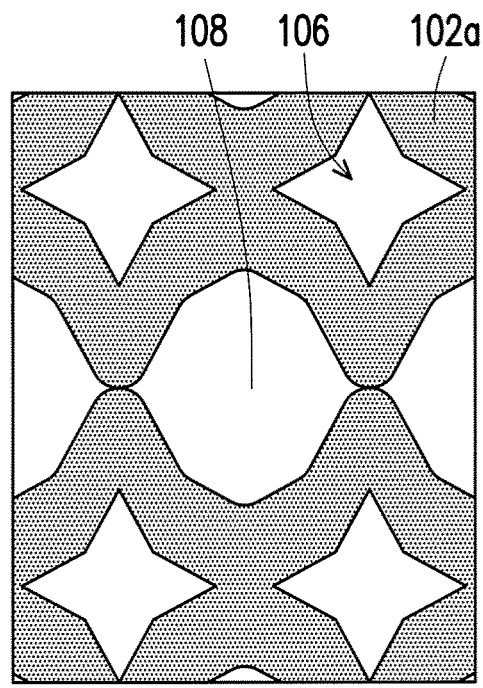
Figure 10P:
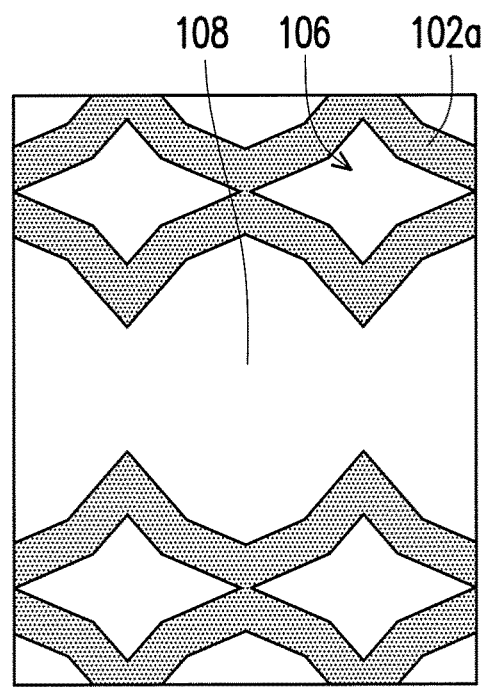
Figure 10Q:
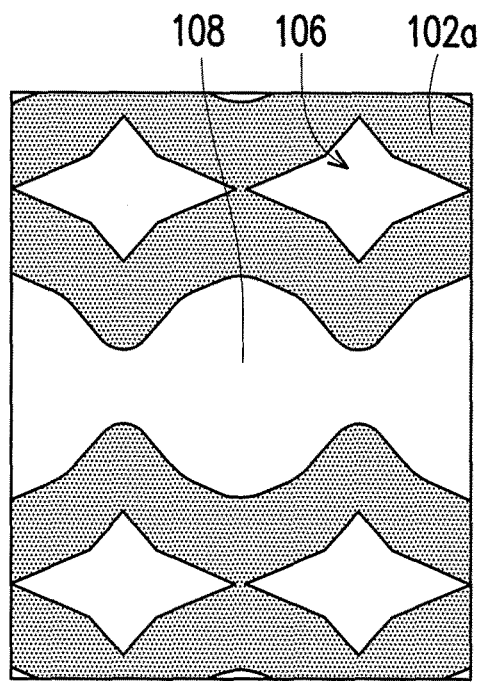
Figure 10R:
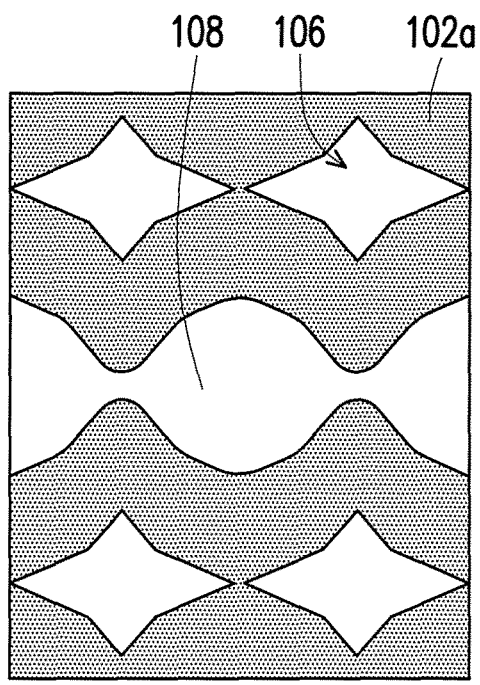
Figure 10S:
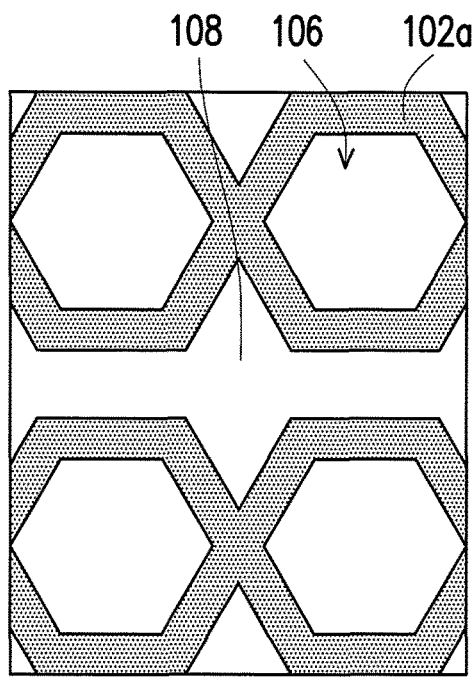
Figure 10T:
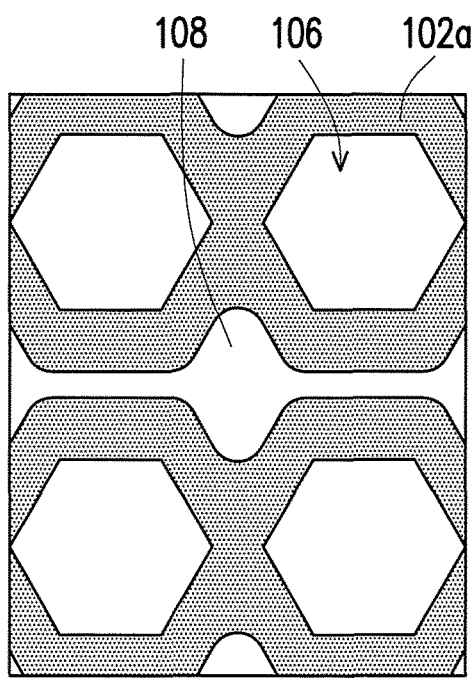
Figure 10U:
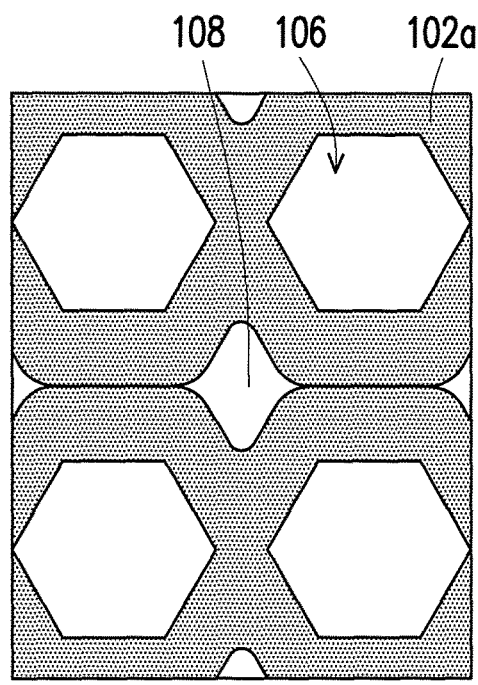
Figure 10V:
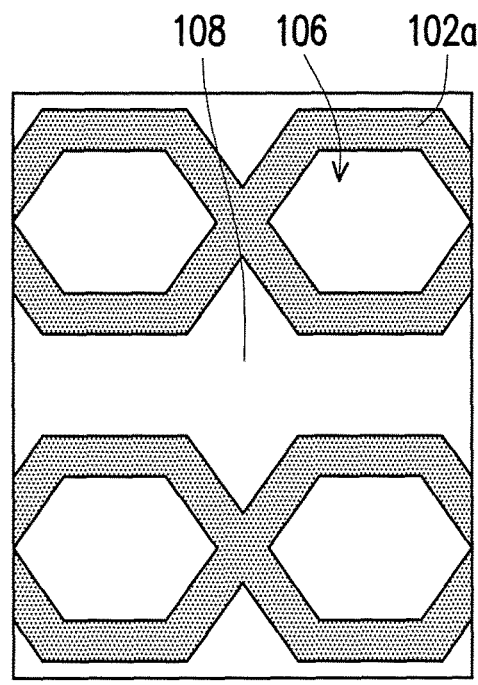
Figure 10W:
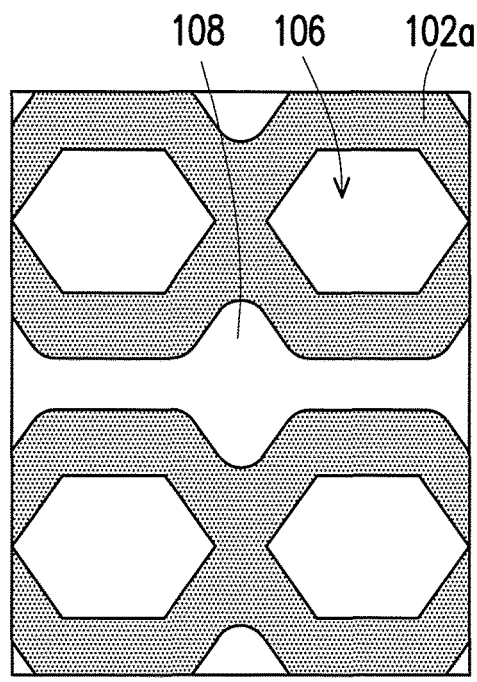
Figure 10X:
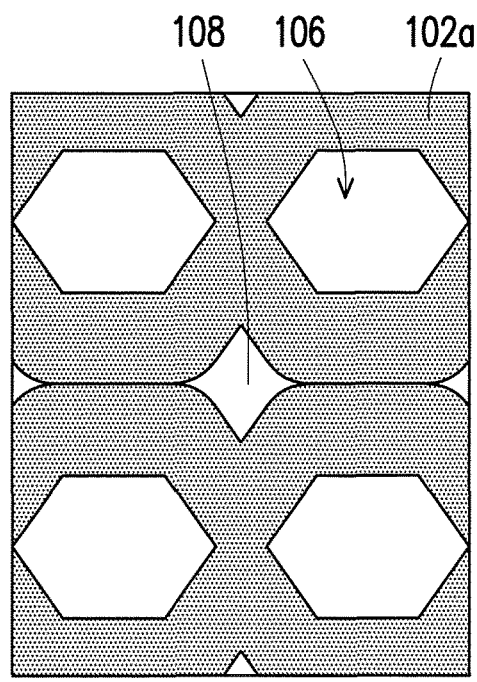

FIG. 10A to FIG. 10X are schematic top views of the support structure according to an embodiment of the invention.

With reference to FIG. 10A to FIG. 10C, if the shape of the opening 106 is circular and the openings 106 are arranged in an array, as the etching time increases, the outer profile of the formed support structure 108 changes from the wave structure (as shown in FIG. 10A) to the corrugated structure (as shown in FIG. 10B), and then to the even smaller corrugated structure (as shown in FIG. 10C), for example. Similarly, referring to FIG. 10D to FIG. 10X, if the shape of the opening 106 is elliptical, rhombic, hexagonal, star-shaped, heart-shaped, mushroom-shaped, double-peak-shaped, bowknot-shaped, or a combination thereof, for example, as the etching time increases, the structure of the formed support structure 108 also changes, such as pillar structure, wave structure, corrugated structure, sheet structure, or a combination thereof. Details thereof will not be repeated hereinafter.

Figure 2A:
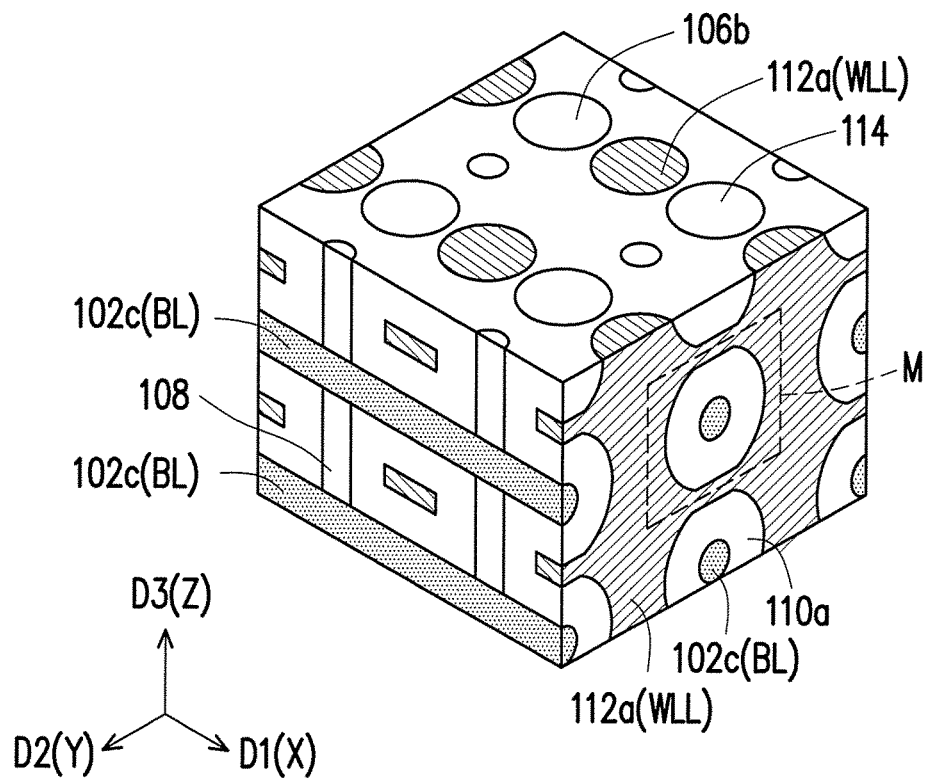
FIG. 2A is a schematic perspective view illustrating a memory device according to the first embodiment of the invention.
Figure 2B:
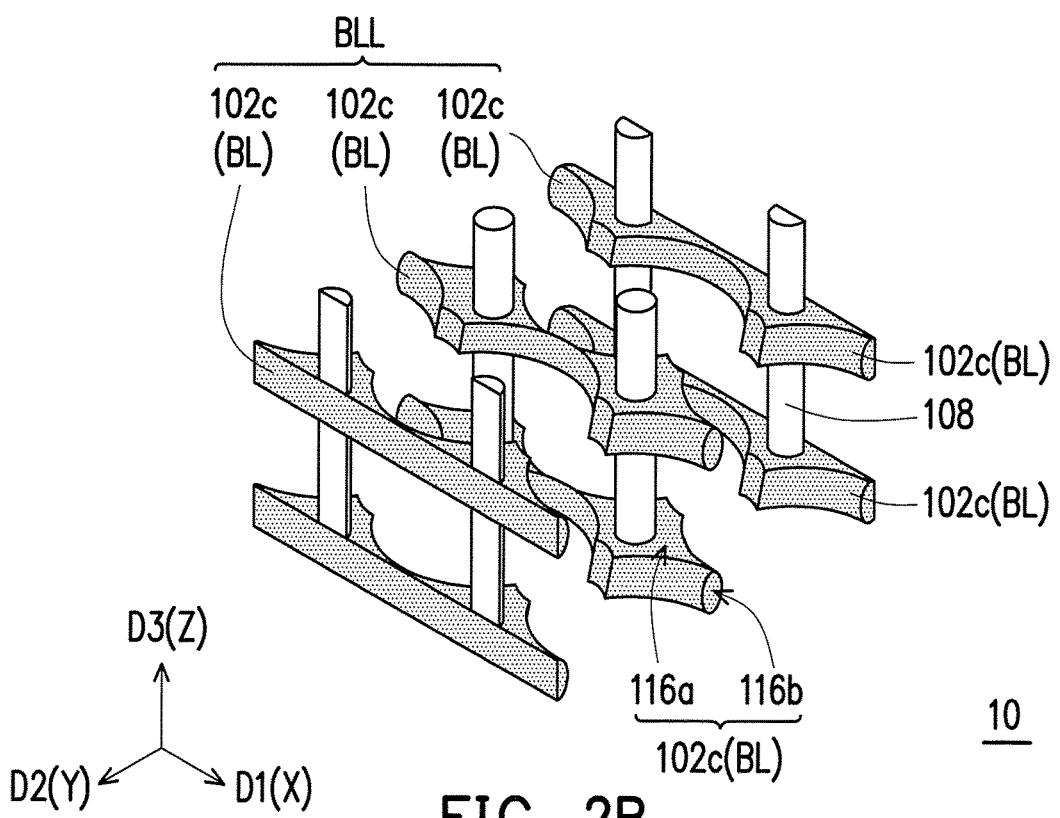
FIG. 2B is a schematic perspective view of a partial memory device of FIG. 2A.

FIG. 2A is a schematic perspective view illustrating a memory device according to the first embodiment of the invention. FIG. 2B is a schematic perspective view of a partial memory device of FIG. 2A. With reference to FIG. 2A and FIG. 2B, FIG. 2B illustrates a partial memory device 10 of FIG. 2A, wherein the charge storage layer 110a, the second conductive line layer 112a, and the dielectric pillar 114 are removed, and only the first conductive lines 102c and the support structures 108 are retained. In the following, the first conductive line is exemplified as a bit line BL, and a second conductive line is exemplified as a word line WLL in order to more clearly describe the memory device of an embodiment of the invention.

With reference to FIG. 2A and FIG. 2B, an embodiment of the invention provides the memory device 10, including a plurality of bit line layers BLL and a plurality of support structures 108. Each of the bit line layers BLL extends along the plane (e.g., the XY plane) defined by the first direction D1 and the second direction D2. Each of the bit line layers BLL has a plurality of bit lines BL extending in the first direction D1. The support structures 108 are located between the adjacent bit line layers BLL. In other words, the support structures 108 are located between the upper and lower bit lines BL. The support structures 108 and the bit lines BL have different shapes. More specifically, each bit line BL includes a plurality of wide portions 116a and a plurality of narrow portions 116b that are arranged alternately, wherein the width of the wide portion 116a is greater than the width of the narrow portion 116b. Each of the support structures 108 is located between the wide portions 116a of adjacent upper and lower two bit lines BL. As shown in FIG. 2A, the memory device 10 of this embodiment of the invention includes a charge storage layer 110a and a plurality of word line layers WLL. The charge storage layer 110a covers upper surfaces, lower surfaces, and two side surfaces of the bit lines BL and surfaces of the support structures 108. Each word line layer WLL is located between adjacent two support structures 108 and surrounds a portion of the charge storage layer 110a around the corresponding bit line BL (i.e. the narrow portion 116b of the bit line BL). The word line layers WLL extend along the plane (e.g., the YZ plane) defined by the second direction D2 and the third direction D3. The first direction D1, the second direction D2, and the third direction D3 are perpendicular to each other.

In other words, in one embodiment of the invention, the memory device 10 includes a plurality of memory cells M that are arranged in a three-dimensional array. Each memory cell M includes the narrow portion 116b of the bit line BL, a portion of the charge storage layer 110a surrounding the corresponding bit line BL, and a portion of the word line layer WLL covering the corresponding charge storage layer 110a. In other words, each memory cell M is formed by the narrow portion 116b of each bit line BL, a portion of the charge storage layer 110a covering the narrow portion 116b, and a portion of the word line layer WLL. Since at least one support structure 118 is disposed between adjacent two memory cells M, the support structure 108 of the first embodiment of the invention supports the adjacent upper and lower bit lines BL and thereby prevents distortion and collapse of the bit line BL and the three-dimensional memory device thereof.

In another embodiment of the invention, the first conductive line layer is a word line, and the second conductive line layer is a bit line layer.

Figure 4:
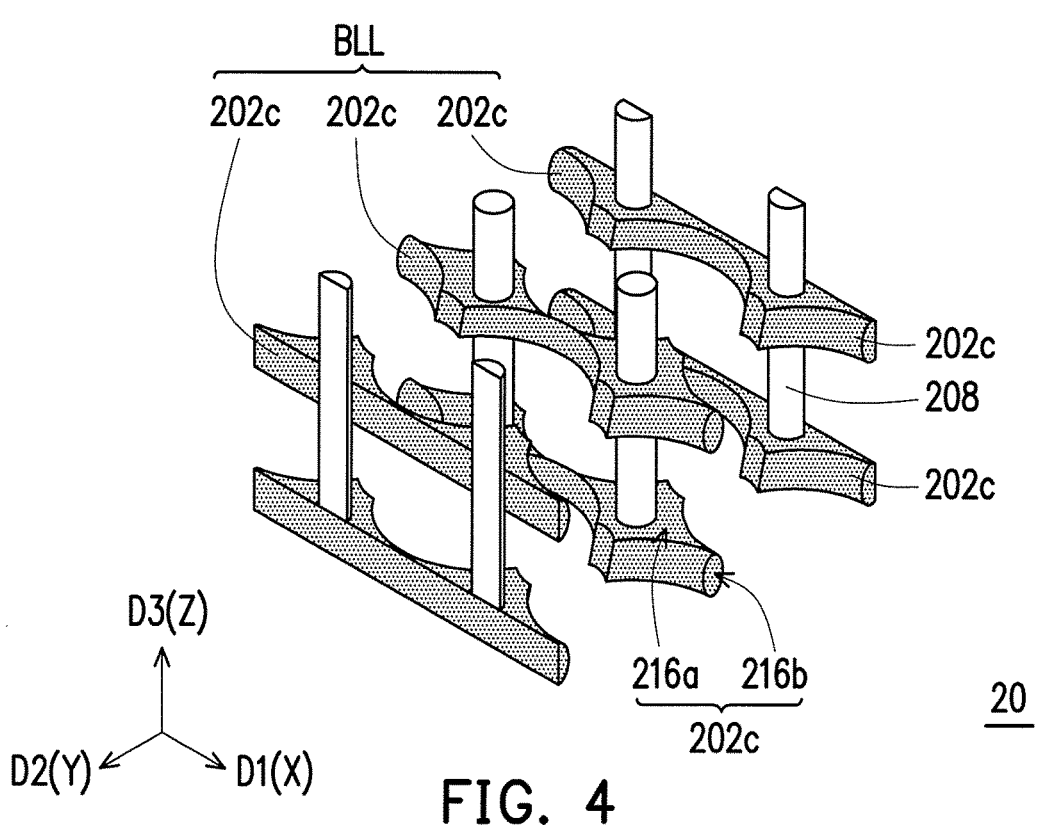
FIG. 4 is a schematic perspective view of a partial memory device of FIG. 3G.

Then, with reference to FIG. 4, the second embodiment of the invention provides another memory device 20 that includes a plurality of first conductive lines 202c and a plurality of support structures 208. The second embodiment is similar to the first embodiment and a difference therebetween is that, in the first embodiment, the first conductive lines 102c are supported by a plurality of non-continuous support structures 108 (FIG. 2) in the third direction D3 (e.g., the Z-axis direction). That is to say, the support structures 108 that are adjacent to each other in the Z-axis direction are separated by the first conductive lines 102c and are non-continuous (FIG. 2). In contrast, in the second embodiment, each support structure 208 is a continuous support structure 208 that passes through at least two first conductive lines 208c, such that each support structure 208 has a continuous support structure (FIG. 4).

FIG. 3A to FIG. 3G are schematic perspective views showing a method of manufacturing the memory device according to the second embodiment of the invention. In the following embodiment, the same or similar elements, components, or layers are represented by similar reference numerals. For example, the first conductive line layer 102 and the first conductive line layer 202 are the same or similar elements. The support structure 108 and the support structure 208 are the same or similar elements. Thus, details thereof are not repeated again.

Figure 3A:
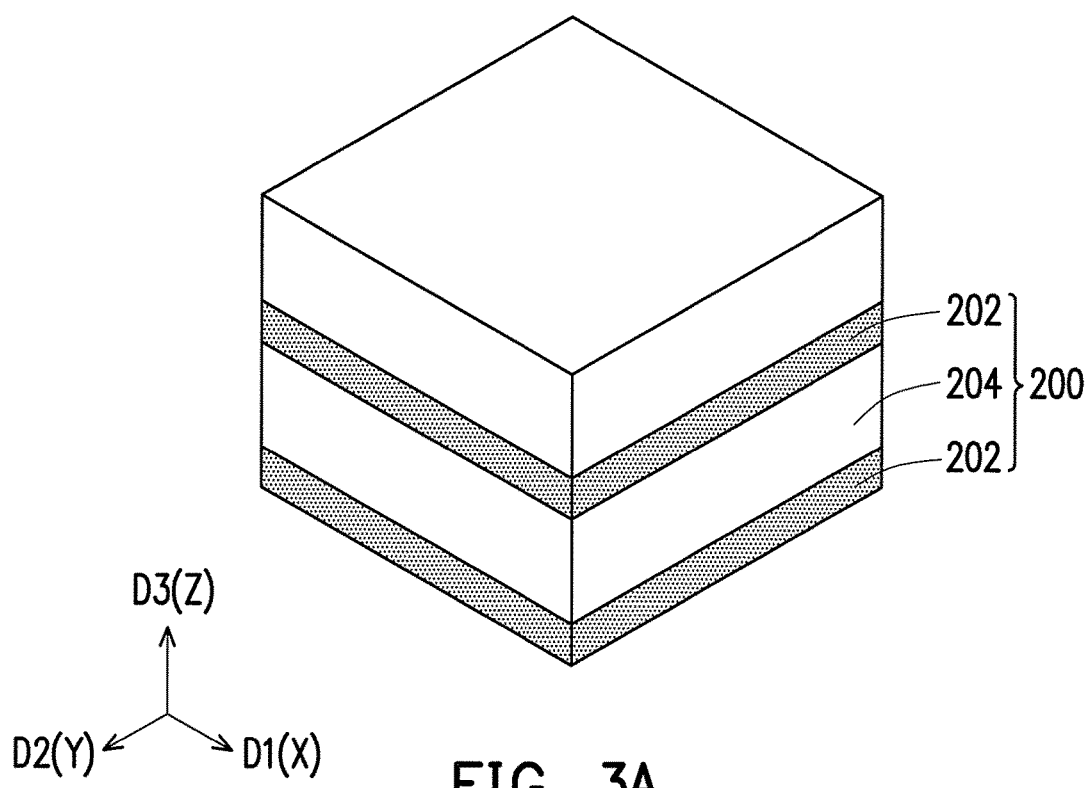
FIG. 3A to FIG. 3G are schematic perspective views showing a method of manufacturing a memory device according to the second embodiment of the invention.

With reference to FIG. 3A, a stack layer 200 is provided. The stack layer 200 includes a plurality of first conductive line layers 202 and a plurality of first material layers 204. The first material layers 204 are disposed between the first conductive line layers 202. The first conductive line layers 202 and the first material layers 204 both extend along the plane (e.g., the XY plane) defined by the first direction D1 and the second direction D2 and are arranged alternately in the third direction D3 (e.g., the Z-axis direction). The material, thickness, and forming method of the first conductive line layer 202 are the same as those of the first conductive line layer 102 of the first embodiment, as described above. The material, thickness, and forming method of the first material layer 204 are the same as those of the support material layer 104 of the first embodiment, as described above. Thus, details thereof are not repeated hereinafter.

Figure 3B:
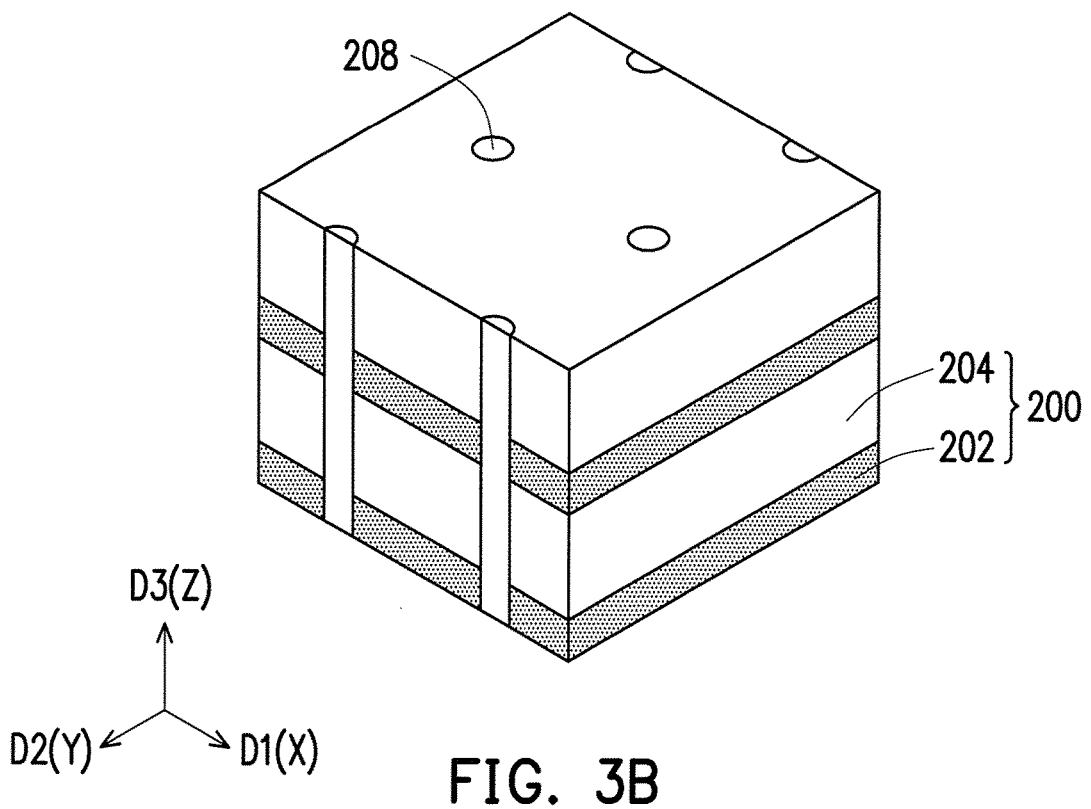

Next, with reference to FIG. 3B, a plurality of support structures 208 are formed in the stack layer 200. The support structure 208 is a continuous structure and passes through the stack layer 200 in the third direction D3 (e.g., the Z-axis direction). More specifically, a plurality of holes (not shown) are formed in the stack layer 200 by performing a lithography and etching process on the stack layer 200. Then, a support structure material layer (not shown) is formed on the stack layer 200 and filled in the holes. The material and forming method of the support structure material layer are the same as those of the support material layer 104 of the first embodiment, as described above. Thus, details thereof are not repeated hereinafter. Next, a top surface of the stack layer 200 is exposed by performing a planarization process on the support structure material layer. In an embodiment, the planarization process may be chemical-mechanical polishing (CMP), for example. In this embodiment, the first conductive line layer 202, the first material layer 204, and the support structure 208 are formed of different materials.

Figure 3C:
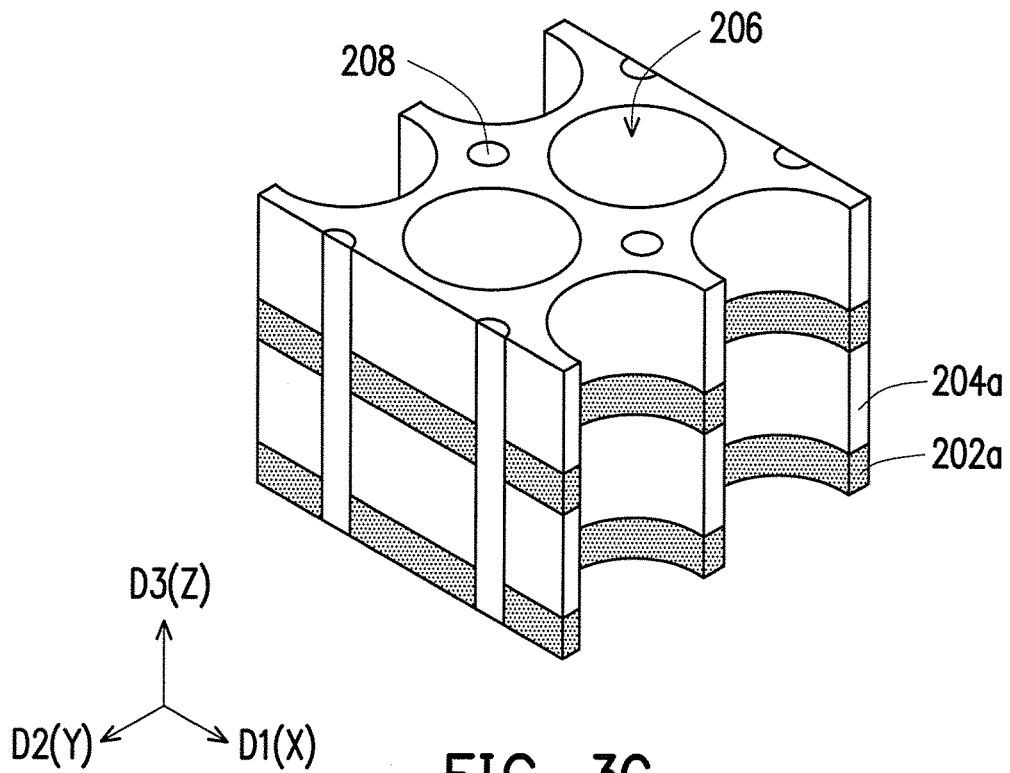

With reference to FIG. 3C, a portion of the first conductive line layers 202 and a portion of the first material layer 204 are removed by patterning the stack layer 200, so as to form a plurality of openings 206 in the stack layer 200. The openings 206 pass through the stack layer 200 in the third direction D3 (e.g., the Z-axis direction). The shape and arrangement of the openings 206 and the support structures 208 are the same as those of the openings 106 and the support structures 108 of the first embodiment, as described above. Thus, details thereof are not repeated hereinafter.

Figure 3D:
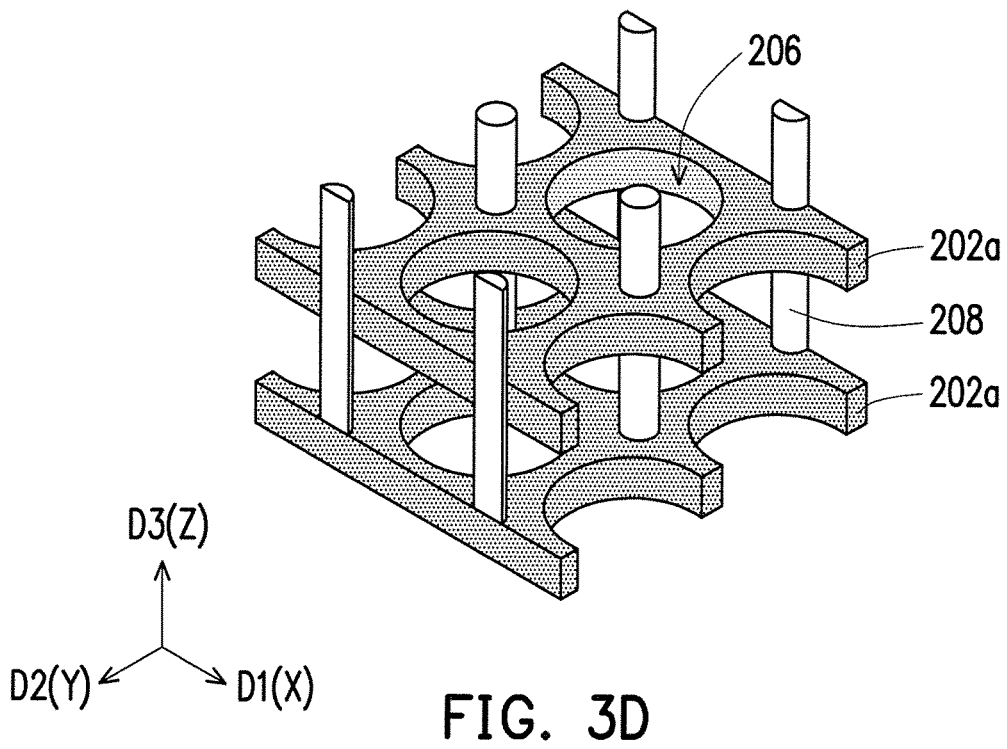

Thereafter, with reference to FIG. 3D, a patterned first material layer 204a is removed through the openings 206 by performing an etching process, so as to expose the support structures 208 between the patterned first conductive line layers 202a. More specifically, because an etching selectivity between the patterned first material layer 204a and the support structure 208 is equal to or greater than 5, and an etching selectivity between the patterned first material layer 204a and the patterned first conductive line layer 202a is equal to or greater than 5, when the etching process is performed, the patterned first material layer 204a is removed completely, and only the patterned first conductive line layer 202a and the support structure 208 that passes through the patterned first conductive line layer 202a remain.

Figure 3E:
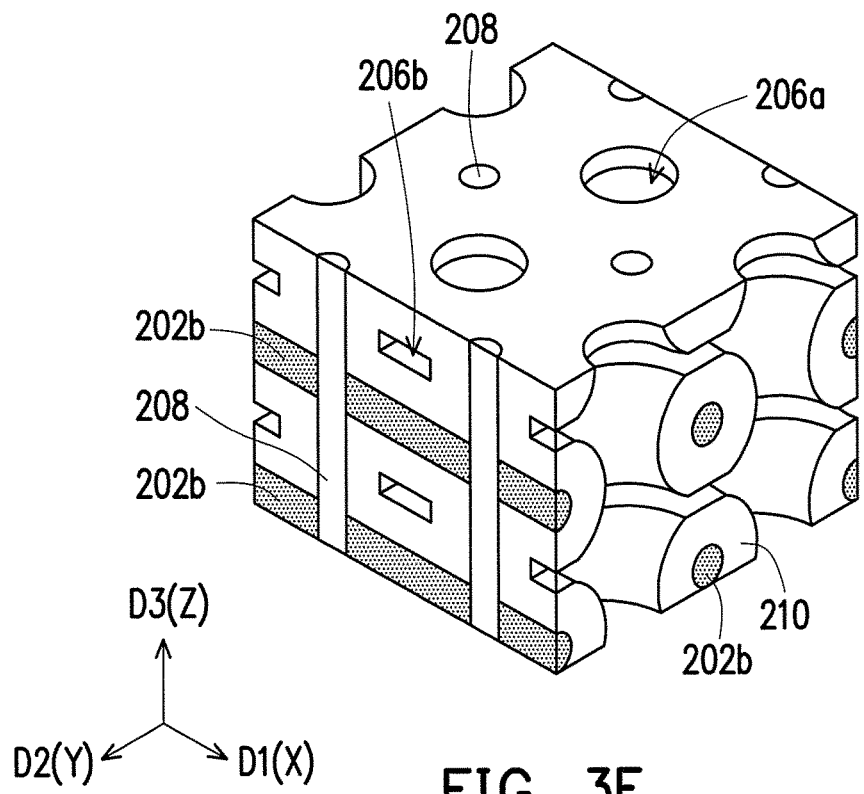
Figure 3F:
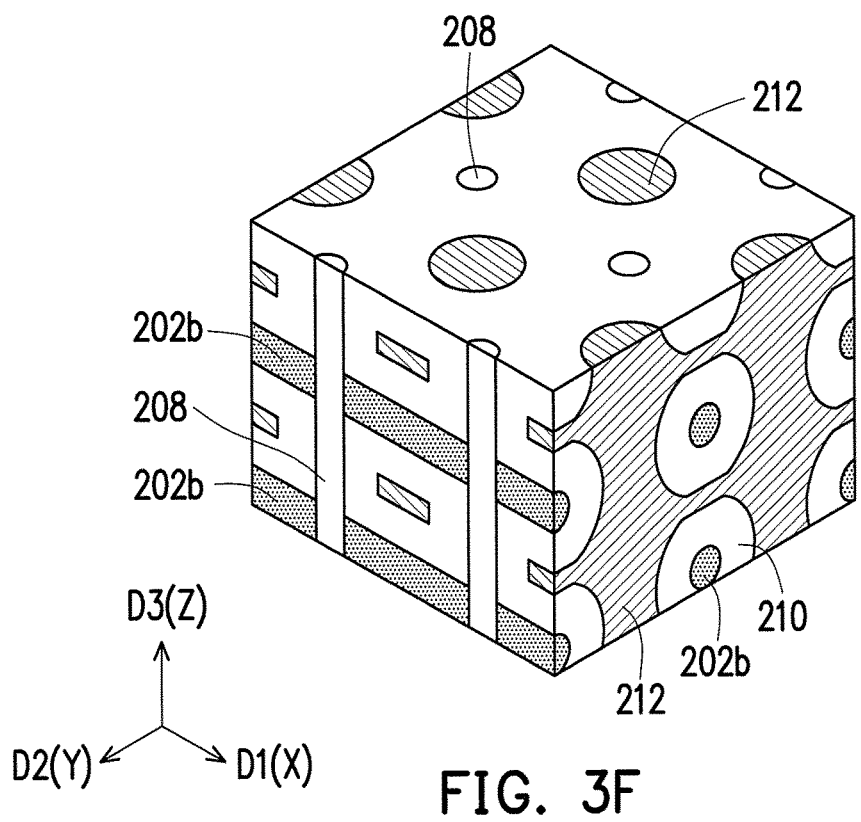
Figure 3G:
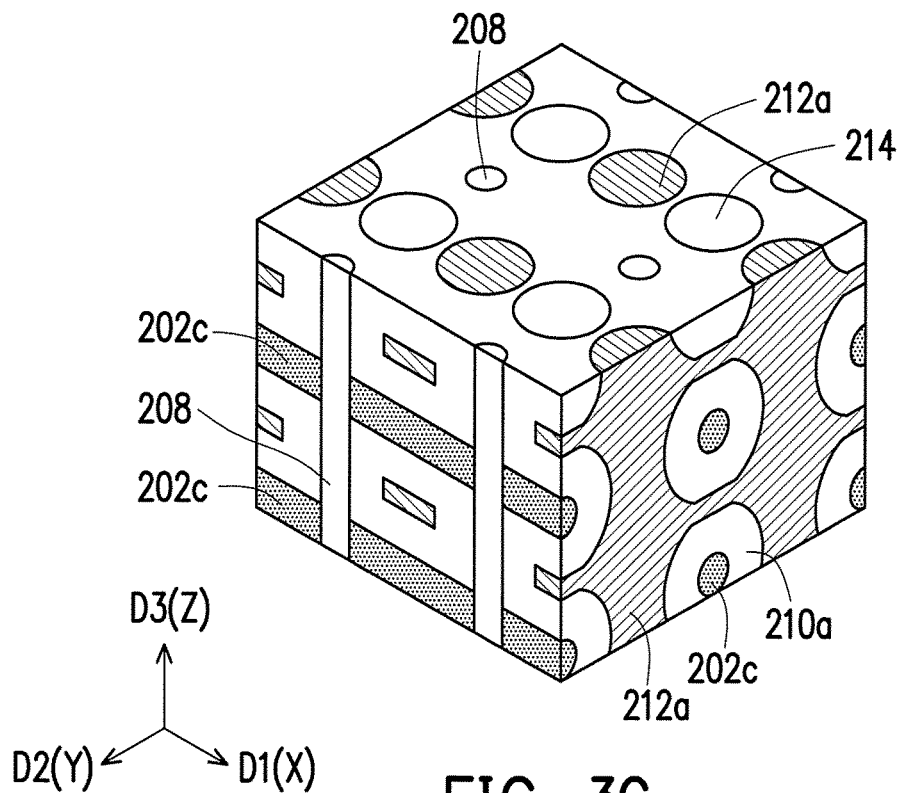

With reference to FIG. 3E to FIG. 3G, the manufacturing steps are the same as FIG. 1E to FIG. 1G, and the materials, thicknesses, and forming methods of the charge storage layer 210 and the conductor layer 212 are the same as those of the charge storage layer 110 and the second conductive line layer 112 of the first embodiment, as described above. Thus, details thereof are not repeated hereinafter.

To sum up, the embodiments of the invention use the memory device having the support structure and the manufacturing method thereof to form multiple support structures between adjacent upper and lower two first conductive lines. Moreover, according to the embodiments of the invention, the parameters of the etching process are adjustable, and based on the shape and arrangement of the openings, the support structures are formed into various shapes and structures. The support structures the embodiments of the invention support the adjacent upper and lower first conductive lines, so as to prevent distortion and collapse of the first conductive lines and the three-dimensional memory device thereof.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A memory device, comprising:
a plurality of first conductive line layers extending along a plane defined by a first direction and a second direction, wherein each of the first conductive line layers comprises a plurality of first conductive lines extending in the first direction;
a plurality of support structures disposed between the adjacent first conductive line layers, wherein the support structures and the first conductive lines have different shapes; and
a charge storage layer touching upper surfaces, lower surfaces, and two side surfaces of the first conductive lines and surfaces of the support structures.

2. The memory device according to claim 1, wherein the first conductive lines and the support structures are formed of different materials.

3. The memory device according to claim 1, wherein the material of the support structures comprises an insulating material, a dielectric material, a low-k material, or a combination thereof.

4. The memory device according to claim 3, wherein the material of the support structure comprises SiO, SiN, SiON, SiOC, SiC, SiOF, SiOH, or a combination thereof.

5. The memory device according to claim 1, wherein each of the support structures is a continuous support structure and further passes through the first conductive lines.

6. The memory device according to claim 1, wherein the support structures comprise a pillar structure, a wave structure, a sheet structure, a corrugated structure, or a combination thereof.

7. The memory device according to claim 1, wherein the support structures comprise a plurality of pillar structures, and a profile of two sidewalls of the pillar structures comprises a rectangle, a trapezoid, a hourglass shape, an egg shape, an irregular shape, or a combination thereof.

8. The memory device according to claim 1, wherein a shape of an upper surface of the support structures comprises a circle, an ellipse, a square, a star shape, a heart shape, a mushroom shape, a double-peak shape, a bowknot shape, or a combination thereof.

9. The memory device according to claim 1, further comprising a plurality of second conductive line layers, wherein each of the second conductive line layers extends along a plane defined by the second direction and a third direction, and each of the second conductive line layers is disposed between adjacent two support structures and surrounds a portion of the charge storage layer around the corresponding one of the first conductive lines, wherein the first direction, the second direction, and the third direction are perpendicular to each other.

10. The memory device according to claim 9, comprising a plurality of memory cells that are arranged in a three-dimensional array, wherein each of the memory cells comprises a portion of one of the first conductive lines, a portion of the charge storage layer surrounding the corresponding one of the first conductive lines, and a portion of one of the second conductive line layers covering the corresponding charge storage layer.

11. The memory device according to claim 10, wherein at least one support structure is disposed between adjacent two memory cells.

12. The memory device according to claim 9, further comprising a plurality of dielectric pillars extending in the third direction and arranged alternately with the second conductive line layers in the first direction.

13. A memory device, comprising:
a plurality of first conductive line layers extending along a plane defined by a first direction and a second direction, wherein each of the first conductive line layers comprises a plurality of first conductive lines extending in the first direction, and each of the first conductive lines includes a plurality of wide portions and a plurality of narrow portions that are arranged alternately;

a plurality of support structures disposed between the adjacent first conductive line layers, wherein the support structures and the first conductive lines have different shapes; and a charge storage layer covering upper surfaces, lower surfaces, and two side surfaces of the first conductive lines and surfaces of the support structures.

14. The memory device according to claim 13, wherein the first conductive lines and the support structures are formed of different materials.

15. The memory device according to claim 13, wherein the material of the support structures comprises an insulating material, a dielectric material, a low-k material, or a combination thereof.

16. The memory device according to claim 13, wherein each of the support structures is a continuous support structure and further passes through the first conductive lines.

17. The memory device according to claim 13, further comprising a plurality of second conductive line layers, wherein each of the second conductive line layers extends along a plane defined by the second direction and a third direction, and each of the second conductive line layers is disposed between adjacent two support structures and surrounds a portion of the charge storage layer around the corresponding one of the first conductive lines, wherein the first direction, the second direction, and the third direction are perpendicular to each other.

18. The memory device according to claim 17, comprising a plurality of memory cells that are arranged in a three-dimensional array, wherein each of the memory cells comprises a portion of one of the first conductive lines, a portion of the charge storage layer surrounding the corresponding one of the first conductive lines, and a portion of one of the second conductive line layers covering the corresponding charge storage layer.

19. The memory device according to claim 18, wherein at least one support structure is disposed between adjacent two memory cells.

20. The memory device according to claim 17, further comprising a plurality of dielectric pillars extending in the third direction and arranged alternately with the second conductive line layers in the first direction.

* * * * *